(12) United States Patent
Kubo et al.

(10) Patent No.: US 6,317,369 B1
(45) Date of Patent: Nov. 13, 2001

(54) SEMICONDUCTOR DEVICE ALLOWING HIGHER SPEED DATA TRANSMISSION TO AND FROM EXTERNAL UNIT

(75) Inventors: Takashi Kubo; Wataru Sakamoto, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/704,048

(22) Filed: Nov. 2, 2000

(30) Foreign Application Priority Data

Nov. 5, 1999 (JP) .................................. 11-315357
Apr. 26, 2000 (JP) .................................. 12-125945

(51) Int. Cl.$^7$ .................................................. G11C 7/00
(52) U.S. Cl. ..................................... 365/193; 365/189.05
(58) Field of Search ................................... 365/193, 194, 365/189.05, 233

(56) References Cited

U.S. PATENT DOCUMENTS

| 5,896,347 | 4/1999 | Tomita et al. | 365/233 |
| 6,172,938 | * 1/2001 | Suzuki et al. | 365/233 |
| 6,188,641 | * 2/2001 | Uchida | 365/233 |
| 6,215,710 | * 4/2001 | Han et al. | 365/193 |

* cited by examiner

Primary Examiner—Son Mai
(74) Attorney, Agent, or Firm—McDermott, Will & Emery

(57) ABSTRACT

When H data is transmitted, an input buffer receives the data by using a rising edge of one of complementary two strobe signals in principle. When L data is transmitted, the input buffer receives the data by using a falling edge of one of the complementary two strobe signals in principle. Since the delay amount of data which changes from L data to H data is almost the same as that of a rising edge of a strobe signal, data is received at high speed according to delay change caused by the polarity of data.

19 Claims, 26 Drawing Sheets

SEMICONDUCTOR DEVICE ALLOWING HIGHER SPEED DATA TRANSMISSION TO AND FROM EXTERNAL UNIT

BACKGROUND OF THE INVENTION

1. Field of the Invention

The present invention relates to semiconductor devices, and more particularly to a semiconductor device including an interface to which a data bus is connected externally.

2. Description of the Background Art

As systems using semiconductor devices operate at higher speed, it is proposed that semiconductor devices, particularly semiconductor memory devices receive data from external units by using data strobe signals which cyclically change in synchronization with the data. The data strobe signal is output from a data transmission side, transmitted on a signal line provided in parallel with a data bus on a printed-circuit board, and input to a semiconductor device which receives the data.

For example, current semiconductor devices, particularly DDR SDRAMs (Double Data Rate Synchronous Dynamic Random Access Memories) include one terminal, for transmitting a data strobe signal, for each chip.

FIG. 30 is a waveform chart for illustrating relations between a conventional data strobe signal and data.

Referring to FIG. 30, at a falling edge of a strobe signal STRB at time t1, the L (low) level of a data signal DQ is latched and received by a semiconductor device.

At time t2, at a rising edge of strobe signal STRB, the H (high) level of data signal DQ is latched and received by the semiconductor device.

At time t3, differently from the case of time t2, the L level of data DQ is received at a rising edge of strobe signal STRB. At time t4, differently from the case of time t1, the H level of data DQ is received at a falling edge of strobe signal STRB.

As described above, when there is one data strobe, it is necessary to receive the H (high) data and the L (low) data at a rising edge of the data strobe and similarly receive the H data and the L data even at a falling edge of the data strobe.

Therefore, correct timing is required for both rising and falling edges of the data strobe signal.

Thus, the differential data strobe method is currently proposed to determine data reception timing by using two strobe signals.

FIG. 31 is an operational waveform chart for illustrating data reception using the differential data strobes.

Referring to FIG. 31, the two strobe signals are complementary strobe signals STRB1, STRB2 which are supplied in synchronization with data. In a semiconductor device, the data reception timing is determined at a crossing of the waveforms of complementary strobe signals STRB1, STRB2.

At time t1 when a falling edge of strobe signal SRTB1 and a rising edge of strobe signal SRTB2 cross each other, the L level of data signal DQ is received by the semiconductor device.

Similarly, at time t2 when a rising edge of strobe signal SRTB1 and a falling edge of strobe signal SRTB2 cross each other, the H level of data signal DQ is received by the semiconductor device.

In the differential data strobe method, however, the accuracy of the data strobe signals cannot be maintained to be high due to data skew which is caused by a phenomenon called SSO (Simultaneously Switching Output).

The SSO will be described briefly. In a device having a large number of output terminals such as a semiconductor memory device, simultaneous outputting of H data from the large number of output terminals drops a power supply potential in the device. Thus, the H data to be output may be delayed. When the large number of output terminals simultaneously output L data, a ground potential rises in the device, thereby delaying the L data. Such a phenomenon is called SSO.

FIG. 32 is a diagram for illustrating skew caused by SSO.

Referring to FIG. 32, when a large number of output terminals simultaneously output H data, a power supply potential falls in the device, thereby delaying the H data to be output. When the large number of output terminals simultaneously output L data, a ground potential rises in the device, thereby delaying the L data.

FIG. 33 is a diagram for illustrating the timing margin of data with respect to a strobe signal when the SSO is caused.

Referring to FIG. 33, assume that data signals DQ1 to DQn−1 provide H data and a data signal DQn provides L data at this time. Because of the SSO, data of data signals DQ1 to DQn−1 is determined, delayed by skew TD as compared with data signal DQn. Therefore, data signal DQn falls to the L level at time t1, and data signals DQ1 to DQn−1 rise to the H level at time t2 which is later than time t1 by the skew TD.

Thereafter, a strobe signal DQS for receiving data signals DQ1 to DQn changes at time t3 after fixed delay time Tfd since data signals DQ1 to DQn are determined.

At time t4, data signal DQn then rises from the L level to the H level.

If the SSO skew occurs to a data signal as described above, an effective window capable of causing data to be received using strobe signal DQS is made smaller by the skew TD. Thus, setup time Ts and hold time Th are both made smaller for a strobe signal reception edge.

In other words, the timing for outputting data becomes early or late according to the number of output terminals for outputting data at which data changes. Therefore, even if strobe signals STRB1, SRTB2 are output at correct timing, data is not received correctly unless the data reception timing is delayed in the semiconductor device by an amount of skew TD caused by SSO.

In a conventional system, a device which has an output transistor to pull up a potential at a terminal and an output transistor to pull down a potential at a terminal needs to have the both characteristics equalized. However, the two problems described below make it very difficult to make such adjustment.

First, the circuit characteristics of a pull up transistor and those of a pull down transistor are different from each other. For example, when an N channel MOS transistor is used as an output transistor, it operates mainly in a non-saturation region if it is used for pulling down. However, the N channel MOS transistor operates mainly in a saturation region if it is used for pulling up.

Second, a pull up transistor and a pull down transistor cause mutually different fluctuation according to processes. For example, when a P channel MOS transistor is used for pulling up and an N channel MOS transistor is used for pulling down, manufacturing variation is different between the P channel MOS transistor and the N channel MOS transistor.

In addition, a conventional open drain system has only a pull down transistor, and the rising time is determined by termination resistance. It is therefore very difficult to equalize the delay time of a rise and that of a fall of an output signal.

SUMMARY OF THE INVENTION

An object of the present invention is to provide a semiconductor device capable of correctly receiving data at high speed even if the delay amount of data changes according to the polarity of output data.

Briefly, the present invention is a semiconductor device including first, second and third terminals, a data input circuit, and an internal circuit. The first terminal receives first data and second data which is input after the first data, the first and second data being supplied externally. The second terminal receives, in synchronization with the first and second data, a strobe signal which is supplied externally. The third terminal receives a complementary strobe signal which is complementary to the strobe signal and is supplied externally. The data input circuit receives the first and second data in response to the strobe signal and the complementary strobe signal in order to output first and second internal data corresponding to the first and second data, respectively. If a logical value of the signal waveform changes to a different logical value at an edge of the signal waveform, the data input circuit includes a selection circuit to select and output, as a first data reception edge at which the first data is received, one of a first edge of the strobe signal corresponding to the first data and a first complementary edge of the complementary strobe signal corresponding to the first data and then select, as a second data reception edge at which the second data is received, such one of a second edge of the strobe signal corresponding to the second data and a second complementary edge of the complementary strobe signal corresponding to the second data that is input later. The internal circuit operates according to the first and second internal data.

According to another aspect of the present invention, a semiconductor device includes first, second and third terminals and a data input circuit. The first terminal receives a data signal which is supplied externally. The second terminal receives, in synchronization with the data signal, a first strobe signal which is supplied externally as a basis of time for receiving the data signal. The third terminal receives a second strobe signal which is supplied externally and is complementary to the first strobe signal. If a logical value of a signal waveform changes to a different logical value at an edge of the signal waveform, the data input circuit receives, in response to the edges of the first and second strobe signals, the data signal to output an internal data signal. The data input circuit receives the data signal in response to a rising edge of one of the first and second strobe signals when the data signal is at a high level, and receives the data signal in response to a falling edge of one of the first and second strobe signals when the data signal is at a low level.

According to still another aspect of the present invention, a semiconductor device includes first, second and third terminals, a data input circuit, and an internal circuit. The first terminal receives a data signal which is supplied externally. The second terminal receives, in synchronization with the data signal, a first strobe signal which is supplied externally as a basis of time for receiving the data signal. The third terminal receives, from an external source, a second strobe signal which is complementary to the first strobe signal. The data input circuit receives the data signal according to the first and second strobe signals and outputs an internal data signal. The data signal includes first data and second data which is input after the first data. If a logical value of a signal waveform changes to a different logical value at an edge of the signal waveform, the data input circuit includes a strobe selection circuit to select, according to the first data, one of the edges of the first and second strobe signals input in synchronization with the second data as a data reception edge as a data reception edge at which the second data is received. The internal circuit operates according to the internal data signal.

Therefore, a main advantage of the present invention is that, even if the delay amount of data changes according to the polarity of output data, data can be received correctly at high speed with little need to adjust internal reception timing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
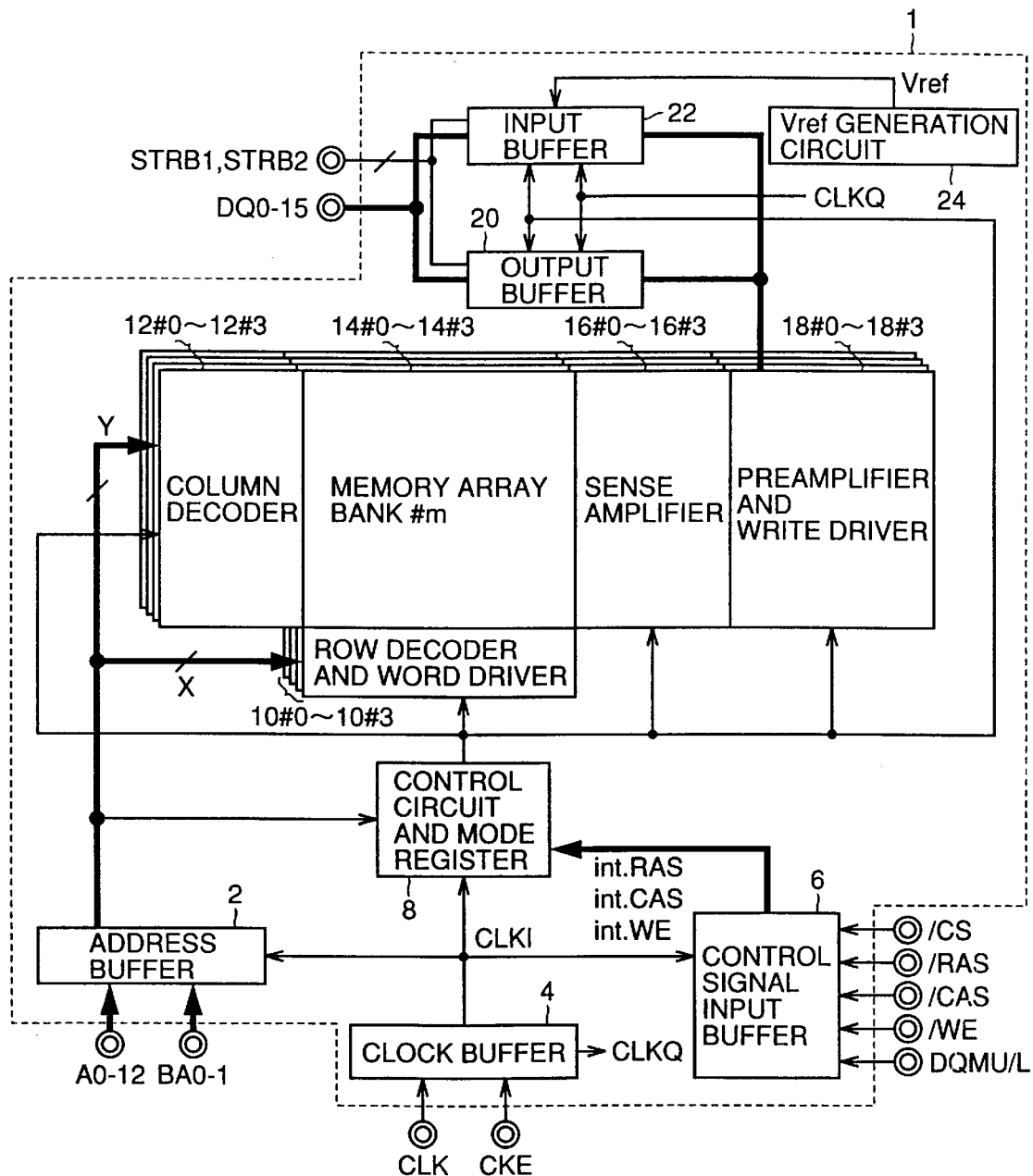
FIG. 1 is a schematic block diagram showing a structure of a semiconductor device 1 in a first embodiment of the present invention.

In the following, the embodiments of the present invention will be described in detail with reference to the drawings. In the drawings, the same reference characters denote the same or corresponding parts.

First Embodiment

FIG. 1 is a schematic block diagram showing a structure of a semiconductor device 1 in a first embodiment of the present invention.

Referring to FIG. 1, semiconductor device 1 includes memory array banks 14#0 to 14#3 each of which has a plurality of memory cells arranged in rows and columns, an address buffer 2 which receives, in synchronization with a clock signal CLKI, address signals A0 to A12 and bank address signals BA0, BA1 that are supplied externally and outputs internal row addresses, internal column addresses and internal bank addresses, a clock buffer 4 which receives a clock signal CLK and a clock enable signal CKE that are supplied externally and outputs clock signals CLKI, CLKQ that are used in the semiconductor memory device, and a control signal input buffer 6 which receives, in synchronization with clock signal CLKI, control signals /CS, /RAS, /CAS, /WE and a mask signal DQMU/L that are supplied externally.

Semiconductor memory device 1 further includes a control circuit which receives the internal address signal from address buffer 2, receives control signals int.RAS, int.CAS, int.WE synchronized with the clock signal from control signal input buffer 6, and outputs a control signal to each block in synchronization with clock signal CLKI, and a mode register which maintains an operation mode that is recognized by the control circuit. In FIG. 1, the control circuit and the mode register are shown in one block 8.

The control circuit includes a bank address decoder to decode internal bank address signals int.BA0, int.BA1, and a command decoder to receive and decode control signals int.RAS, int.CAS, int.WE.

Semiconductor memory device 1 further includes row decoders which are provided to correspond to memory array banks 14#0 to 14#3 and decode row address signals X supplied from address buffer 2, and word drivers which drive addressed rows (word lines) in memory array banks 14#0 to 14#3 to a selected state according to output signals from the row decoders. In FIG. 1, the row decoders and the word drivers are collectively shown as blocks 10#0 to 10#3.

Semiconductor memory device 1 further includes column decoders 12#0 to 12#3 which decode internal column address signals Y supplied from address buffer 2 and generate column selection signals, and sense amplifiers 16#0 to 16#3 which sense and amplify data of memory cells connected to selected columns in memory array banks 14#0 to 14#3.

Semiconductor memory device 1 further includes an input buffer 22 which externally receives write data and generates internal write data, write drivers which amplify internal write data from input buffer 22 and transmits the data to selected memory cells, preamplifiers which amplify data read from the selected memory cells, and an output buffer 20 which buffers and externally outputs the data from the preamplifiers.

The preamplifiers and the write drivers are provided to correspond to memory array banks 14#0 to 14#3. In FIG. 1, the preamplifiers and the write drivers are collectively shown as blocks 18#0 to 18#3.

Input buffer 22 receives data DQ0 to DQ15, which are supplied externally to a terminal, according to mutually complementary strobe signals STRB1, STRB2. Strobe signals STRB1, STRB2 are output in synchronization with data by another semiconductor device or the like which outputs the data to semiconductor memory device 1, and strobe signals STRB1, STRB2 serve as a basis of data reception time. Semiconductor memory device 1 receives strobe signals STRB1, STRB2 which are transmitted externally together with data and supplied to two terminals, and uses the strobe signals as a basis of data signal reception.

Semiconductor memory device 1 further includes a Vref generation circuit 24 which generates a reference potential Vref. Reference potential Vref is input to the input buffer and serves as a basis of the threshold for data reception.

When semiconductor memory device 1 outputs data to an external unit, output buffer 20 outputs data DQ0 to DQ15 in synchronization with clock signal CLKQ and outputs, to the external unit, strobe signals STRB1, STRB2 for another semiconductor device to receive the data signal.

Figure 2:
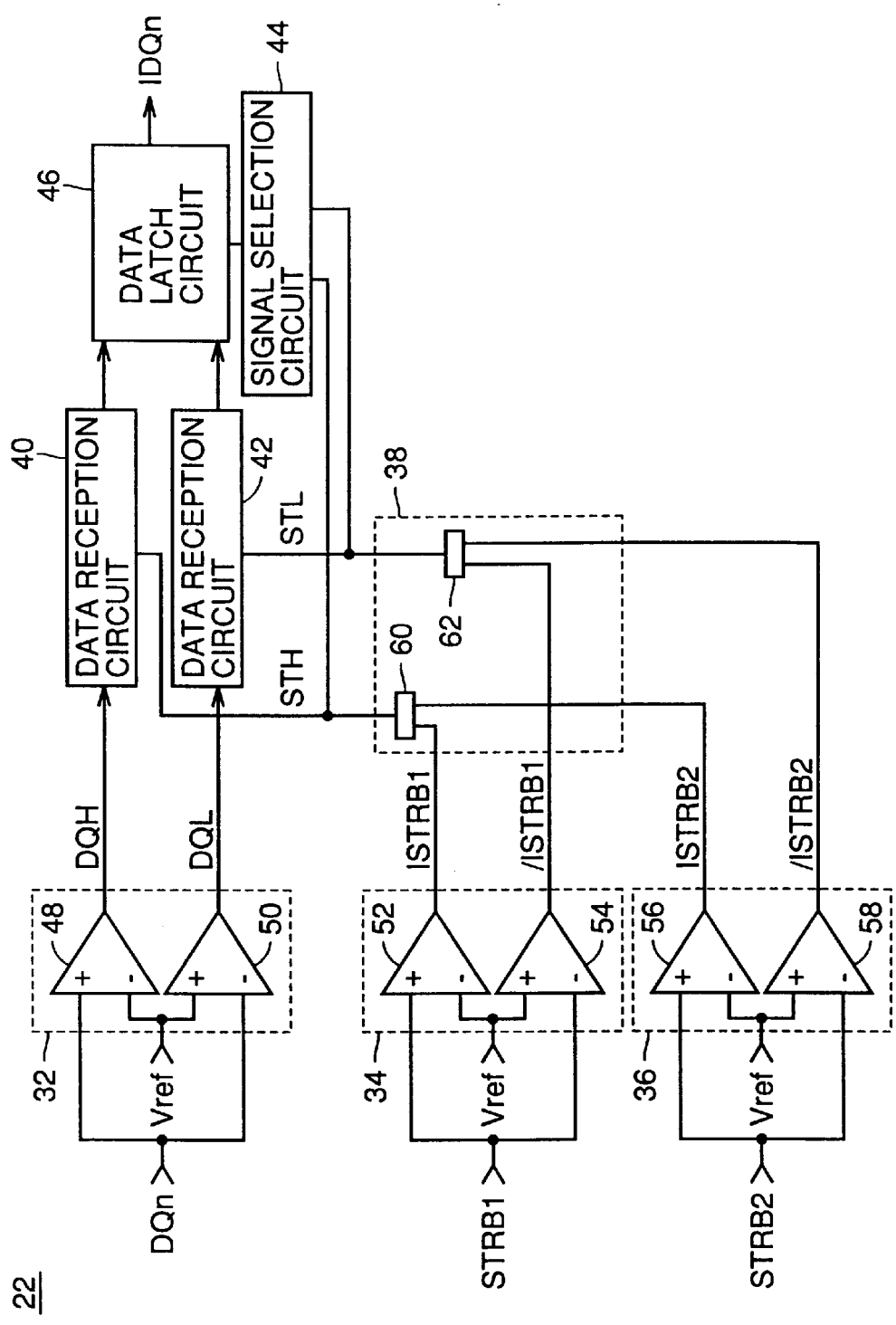
FIG. 2 is a circuit diagram showing a structure of input buffer 22 shown in FIG. 1.

FIG. 2 is a circuit diagram showing a structure of input buffer 22 shown in FIG. 1.

Referring to FIG. 2, input buffer 22 includes an internal strobe generation circuit 34 which receives strobe signal STRB1 and reference potential Vref and outputs complementary internal strobe signals ISTRB1, /ISTRB1, an internal strobe generation circuit 36 which receives strobe signal STRB2 and reference potential Vref and outputs internal strobe signals ISTRB2, /ISTRB2, and a conversion circuit 38 which receives internal strobe signals ISTRB1, /ISTRB1, ISTRB2, /ISTRB2 and outputs a strobe signal STH for H data reception and a strobe signal STL for L data reception.

Input buffer 22 further includes a complementary data generation circuit 32 which receives data signal DQn and reference potential Vref and outputs complementary internal data DQH, DQL, a data reception circuit 40 which receives internal data DQH as H data according to strobe signal STH, and a data reception circuit 42 which receives internal data DQL as L data according to strobe signal STL.

When the data is at the H level, the data is received with its original polarity. When the data is at the L level, the data is inverted before it is received. Since the data is transmitted in this manner, the influences of the data polarity on internal processing can be reduced.

Input buffer 22 further includes a signal selection circuit 44 which selects one of strobe signals STH, STL which comes late, and a data latch circuit 46 which receives data from data reception circuits 40, 42 according to an output of signal selection circuit 44. Data latch circuit 46 outputs internal data IDQn.

Complementary data generation circuit 32 includes a differential amplification circuit 48 which receives data signal DQn at its + input node and reference potential Vref at its − input node and outputs internal data signal DQH, and a differential amplification circuit 50 which receives reference potential Vref at its + input node and data signal DQn at its − input node.

Internal strobe generation circuit 34 includes a differential amplification circuit 52 which receives strobe signal STRB1 at its + input node and reference potential Vref at its − input node and outputs internal strobe signal ISTRB1, and a differential amplification circuit 54 which receives reference potential Vref at its + input node and strobe signal STRB1 at its − input node and outputs internal strobe signal /ISTRB1.

Internal strobe generation circuit 36 includes a differential amplification circuit 56 which receives strobe signal STRB2 at its + input node and reference potential Vref at its − input node and outputs internal strobe signal ISTRB2, and a differential amplification circuit 58 which receives reference potential Vref at its + input node and strobe signal STRB2 at its − input node and outputs internal strobe signal /ISTRB2.

Conversion circuit 38 includes a reception control circuit 60 which receives internal strobe signals ISTRB1, ISTRB2 and outputs strobe signal STH for H data reception, and a reception control circuit 62 which receives internal strobe signals /ISTRB1, /ISTRB2 and outputs strobe signal STL for L data reception.

Figure 3:
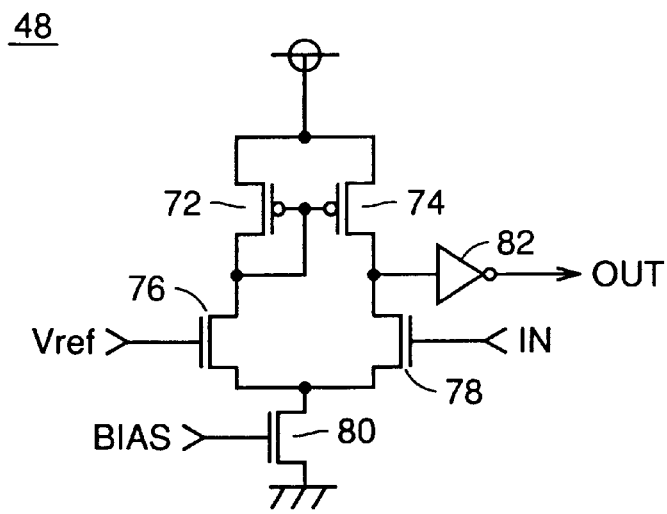
FIG. 3 is a circuit diagram showing a structure of differential amplification circuit 48 in FIG. 2.

FIG. 3 is a circuit diagram showing a structure of differential amplification circuit 48 in FIG. 2.

Referring to FIG. 3, differential amplification circuit 48 includes an N channel MOS transistor 76 which receives reference potential Vref at its gate, a P channel MOS transistor 72 which has its gate and drain connected to the drain of N channel MOS transistor 76 and its source connected to a power supply node, a P channel MOS transistor 74 which has its gate connected to the drain of N channel MOS transistor 76 and its source connected to the power supply node, an N channel MOS transistor 78 which has its gate supplied with an input signal IN, its source connected to the source of N channel MOS transistor 76 and its drain connected to the drain of P channel MOS transistor 74, an N channel MOS transistor 80 which has its gate supplied with a signal BIAS and is connected between the source of N channel MOS transistor 76 and a ground node, and an inverter 82 which receives a potential at the drain of N channel MOS transistor 78 at its input, inverts the potential and outputs an output signal OUT.

Since each of differential amplification circuits 50 to 58 in FIG. 2 has a similar structure to that of differential amplification circuit 48, the description will not be repeated.

Figure 4:
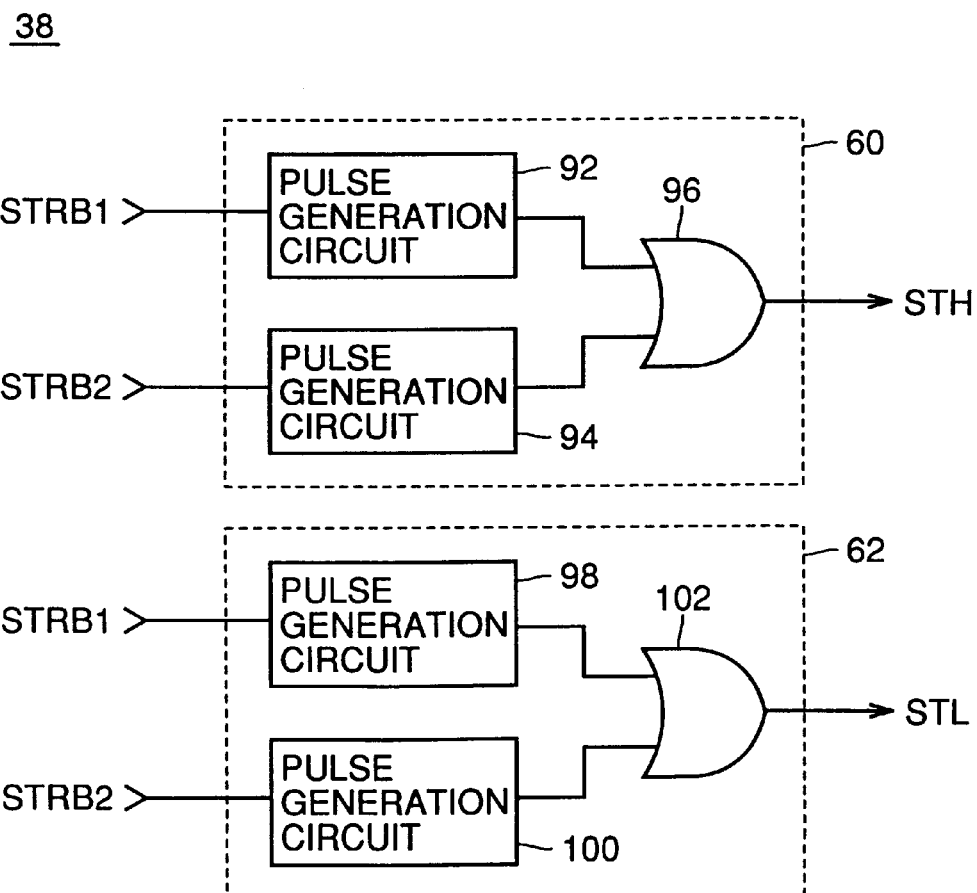
FIG. 4 is a circuit diagram showing a structure of conversion circuit 38 in FIG. 2.

FIG. 4 is a circuit diagram showing a structure of conversion circuit 38 in FIG. 2.

Referring to FIG. 4, conversion circuit 38 includes reception control circuits 60, 62.

Reception control circuit 60 includes a pulse generation circuit 92 which receives strobe signal ISTRB1 and generates a pulse in response to a rise of the signal, a pulse generation circuit 94 which generates a pulse in response to a rise of internal strobe signal ISTRB2, and an OR circuit 96 which receives outputs of power generation circuits 92, 94 and outputs strobe signal STH.

Reception control circuit 62 includes a pulse generation circuit 98 which generates a pulse in response to a rise of internal strobe signal /ISTRB1, a pulse generation circuit 100 which generates a pulse in response to a rise of internal strobe signal /ISTRB2, and an OR circuit 102 which receives outputs of pulse generation circuits 98, 100 and outputs strobe signal STL.

FIG. 4 shows the method of producing one-short pulses from the differential amplification circuit outputs and taking an OR of the one-short pulses. Besides, a circuit which employs the trigger method of using the edges of strobe signals STRB1, STRB2 to trigger data reception, that is, the "edge trigger method" may be used.

Figure 5:
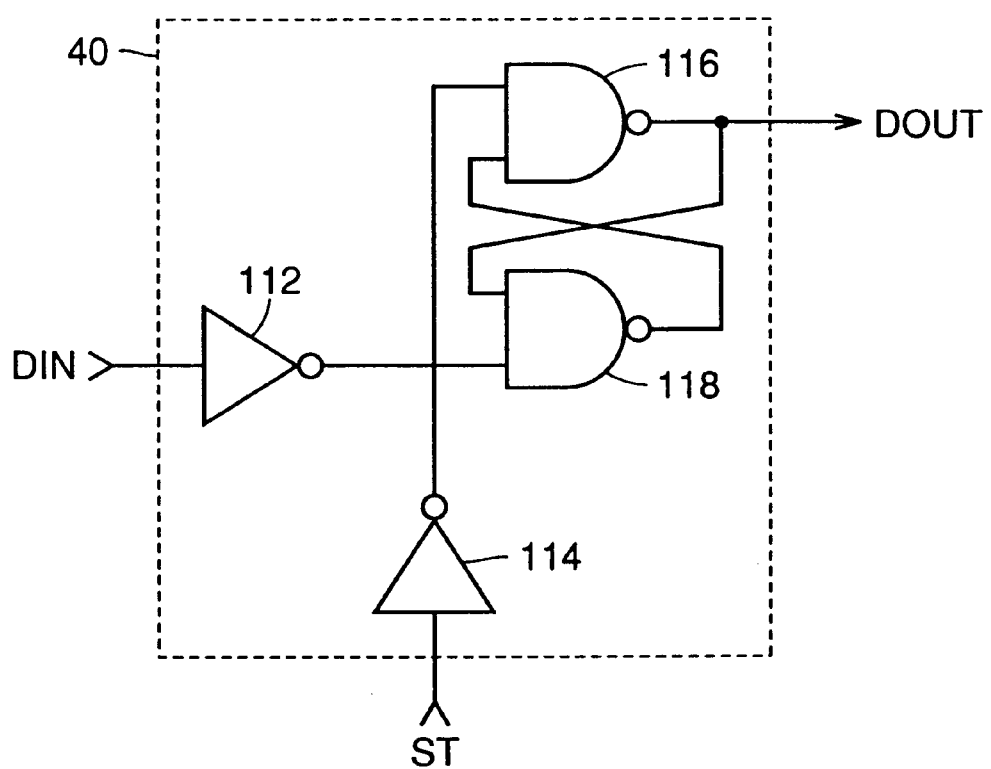
FIG. 5 is a circuit diagram showing a structure of data reception circuit 40 in FIG. 2.

FIG. 5 is a circuit diagram showing a structure of data reception circuit 40 in FIG. 2.

Referring to FIG. 5, data reception circuit 40 includes an inverter 112 which receives and inverts a data input DIN, an inverter 114 which receives and inverts a strobe signal input ST, an NAND circuit 118 which receives an output of inverter 112 at one input, and an NAND circuit 116 which receives outputs of inverter 114 and NAND circuit 118 and outputs a data output signal DOUT.

Data output signal DOUT is supplied to the other input of NAND circuit 118.

Figure 6:
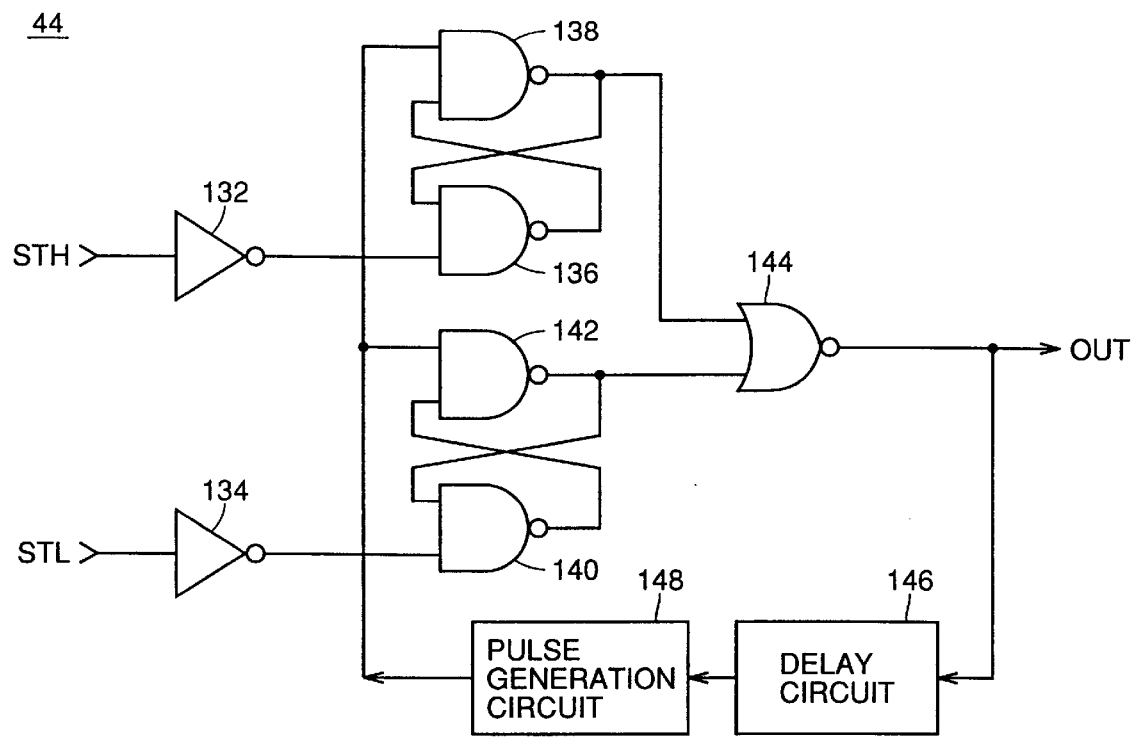
FIG. 6 is a circuit diagram showing a structure of signal selection circuit 44 in FIG. 2.

Since data reception circuit 42 in FIG. 2 has a similar structure to that of data reception circuit 40, its description will not be repeated, FIG. 6 is a circuit diagram showing a structure of signal selection circuit 44 in FIG. 2.

Referring to FIG. 6, signal selection circuit 44 includes an inverter 132 which receives and inverts strobe signal STH, an inverter 134 which receives and inverts strobe signal STL, NAND circuits 138, 136 which form a cross-coupled flip-flop, NAND circuits 142, 140 which form a cross-coupled flip-flop, an NOR circuit 144 which receives outputs of NAND circuits 138, 142 and outputs signal OUT as an output of signal selection circuit 44, a delay circuit 146 which receives and delays signal OUT, and a pulse generation circuit 148 which generates an L level pulse with a prescribed width from an output of delay circuit 146.

NAND circuits 138, 142 are supplied with an output of pulse generation circuit 148, NAND circuit 136 is supplied with an output of inverter 132, and NAND circuit 140 is supplied with an output of inverter 134.

The operation of signal selection circuit 44 will be described briefly.

In an initial state, the output of pulse generation circuit 148 is once driven to the L level such as by a power-on reset signal, not shown. The outputs of the flip-flop formed of NAND circuits 138, 136 and the flip-flop formed of NAND circuits 140, 142 both attain the H level, and signal OUT attains the L level.

Thereafter, the reset of pulse generation circuit 148 is canceled, and the output of pulse generation circuit 148 attains the H level. In this state, selection circuit 44 enters a waiting state to wait for a strobe signal input.

When strobe signal STH then attains the H level, the output of NAND circuit 138 is driven to the L level. At this time, signal OUT is not changed yet.

When strobe signal STL attains the H level, the output of NAND circuit 142 is driven to the L level. Then, the inputs of NOR circuit 144 are both at the L level, and signal OUT rises to the H level. In other words, signal OUT rises in response to an edge of one of the two strobe signals which is input later.

Signal OUT is transmitted by delay circuit 146 to pulse generation circuit 148. Pulse generation circuit 148 generates a pulse which maintains its L level for a prescribed time period in response to a rise of signal OUT. Then, the outputs of the flip-flop formed of NAND circuits 138, 136 and the flip-flop formed of NAND circuits 140, 142 both attain the H level, and signal OUT attains the L level. Thus, selection circuit 44 again enters the waiting state to wait for a strobe signal input.

Figure 7:
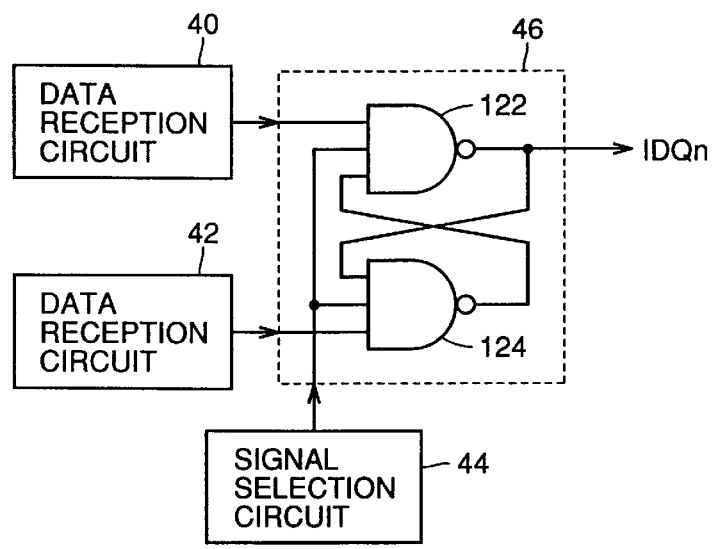
FIG. 7 is a circuit diagram showing a structure of data latch circuit 46.

FIG. 7 is a circuit diagram showing a structure of data latch circuit 46.

Referring to FIG. 7, data latch circuit 46 includes three-input NAND circuits 122, 124. NAND circuit 122 receives outputs of NAND circuit 124, data reception circuit 40 and signal selection circuit 44 and outputs internal data signal IDQn. NAND circuit 124 receives outputs of data reception circuit 42 and signal selection circuit 44 and internal data signal IDQn and outputs a signal according to the input of NAND circuit 122.

Figure 8:
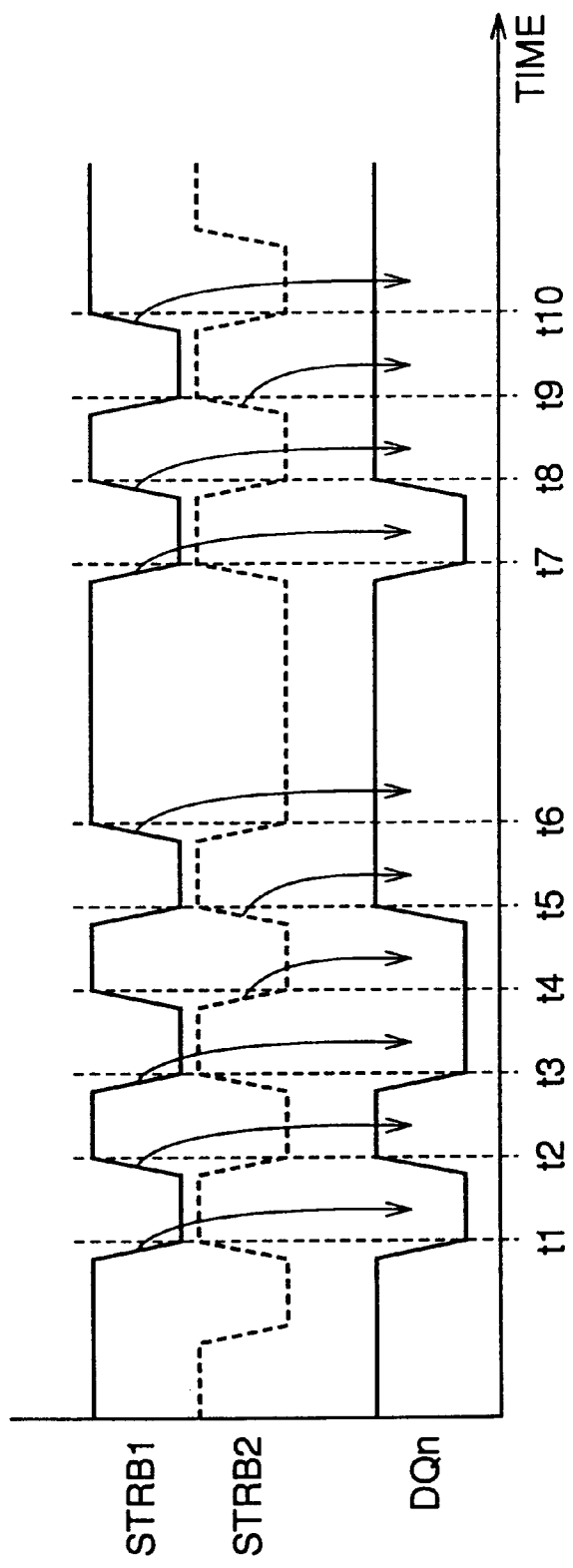
FIG. 8 is an operational waveform chart for illustrating signal reception by input buffer 22 shown in FIG. 2.

FIG. 8 is an operational waveform chart for illustrating signal reception by input buffer 22 shown in FIG. 2.

Referring to FIGS. 2 and 8, when L level data signal DQn is supplied externally at time t1, the L level of data signal DQn is received internally as internal data IDQn according to a signal which signal selection circuit 44 generates in response to a fall of strobe STRB1.

At time t2 when data signal DQn attains the H level, the H level of data signal DQn is received as internal data signal IDQn according to a signal which signal selection circuit 44 generates in response to a rise of strobe signal STRB1.

At time t3, the L level of data signal DQn is similarly received in response to a falling edge of strobe signal STRB1.

At time 4, the data signal is at the L level and data strobe signal STRB1 is rising. In this case, the L level of data signal DQn is received by the semiconductor device according to a signal which is generated in response to a falling edge of strobe signal STRB2.

At time t5, data signal DQn is at the H level and strobe signal STRB1 is falling at this time. In this case, the H level of data signal DQn is received in response to a rising edge of strobe signal STRB2.

In short, H data is received by using one of data strobe signals STRB1, STRB2 which is rising at that time. On the contrary, L data is received by using one of data strobe signals STRB1, STRB2 which is falling at that time.

In this manner, an edge of the data strobe signals, which is used for data reception, is selected according to input data.

Figure 9:
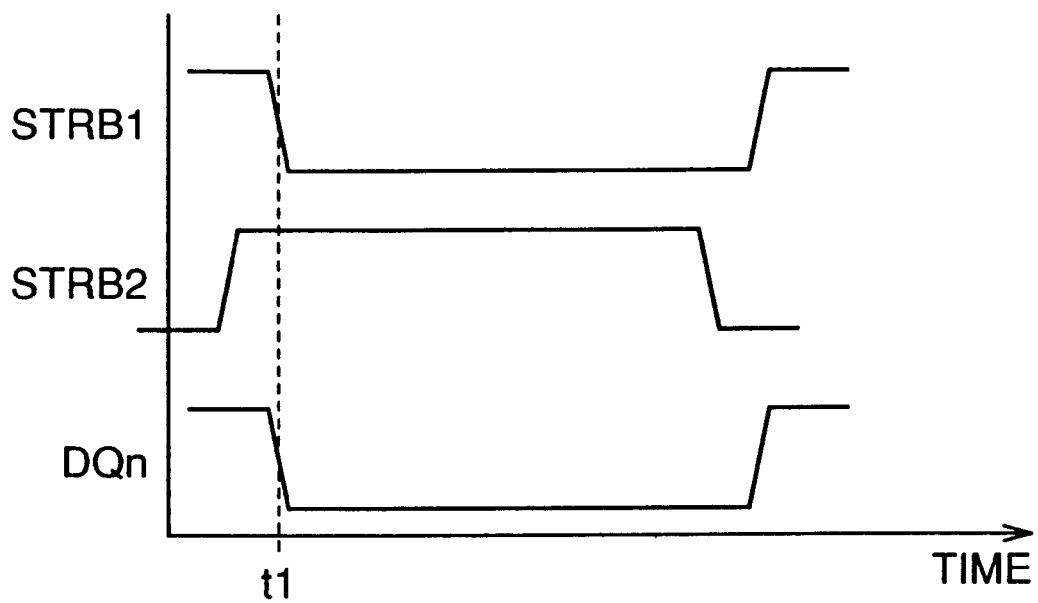
FIG. 9 is a chart for illustrating relations between a reception edge and data delay.

FIG. 9 is a chart for illustrating relations between a reception edge and data delay.

Referring to FIG. 9, incoming L data reaches the semiconductor device at time t1, At this time, the disadvantageous effects of SSO on the L data on the system bus line are similar to those on a falling edge of strobe signal STRB1.

Therefore, the delay time of data is the same as that of strobe signal STRB1, and thus adjustment of internal reception timing is rarely required.

Similarly, when H data is transmitted, reception mistakes of the transmitted data are similarly reduced by using one of the two complementary strobe signals which is rising at that time.

Second Embodiment

Figure 10:
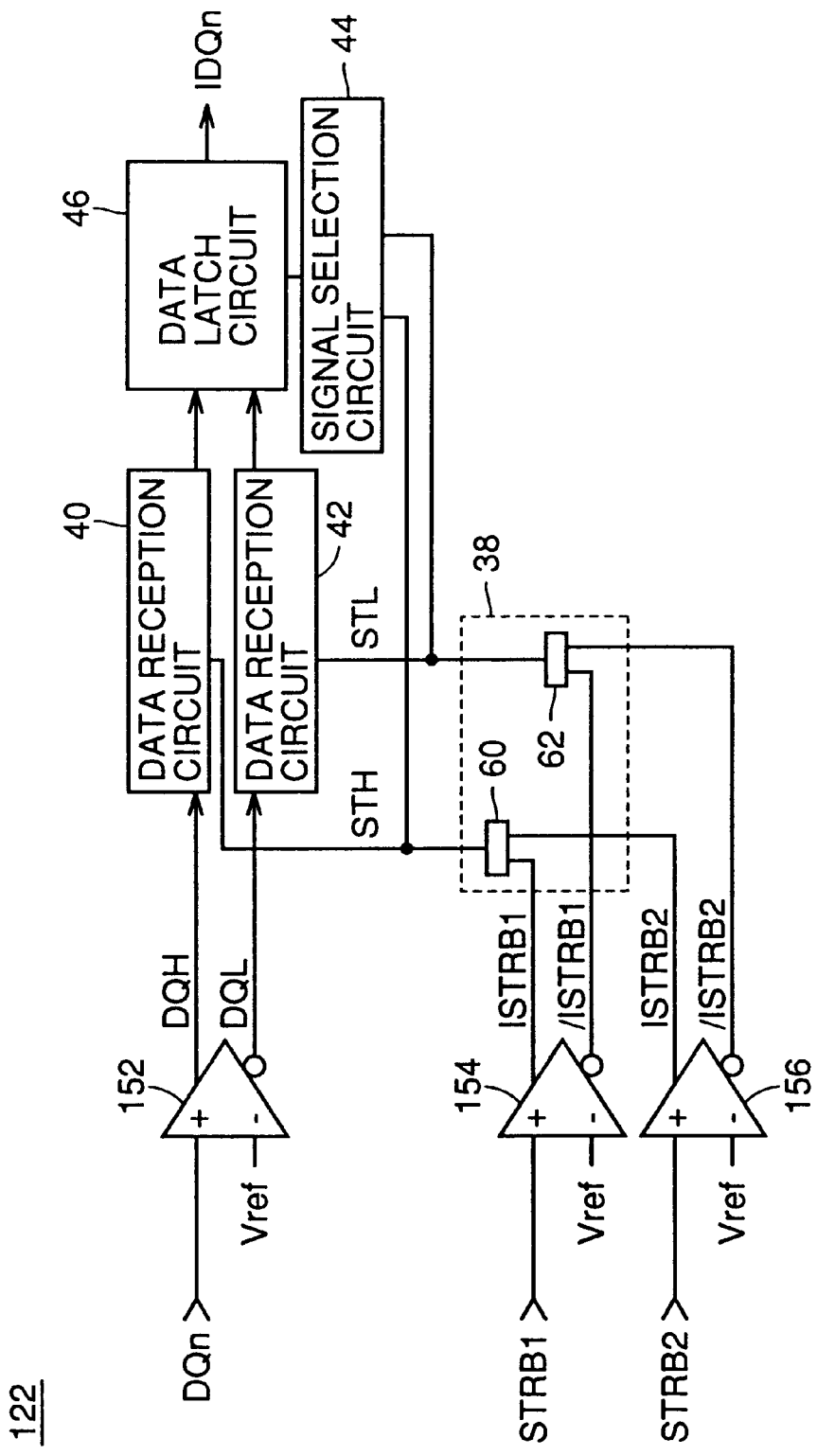
FIG. 10 is a circuit diagram showing a structure of an input buffer 122 used in a second embodiment of the present invention.

FIG. 10 is a circuit diagram showing a structure of an input buffer 122 used in a second embodiment of the present invention.

Referring to FIG. 10, input buffer 122 is different from input buffer 22 shown in FIG. 2 in that it includes a differential amplification circuit 152 instead of complementary data generation circuit 32, a differential amplification circuit 154 instead of internal strobe generation circuit 34, and a differential amplification circuit 156 instead of internal strobe generation circuit 36. As described above, the semiconductor device is different from the semiconductor device in the first embodiment.

Since other structures are similar to those of input buffer 22 shown in FIG. 2, their description will not be repeated.

Figure 11:
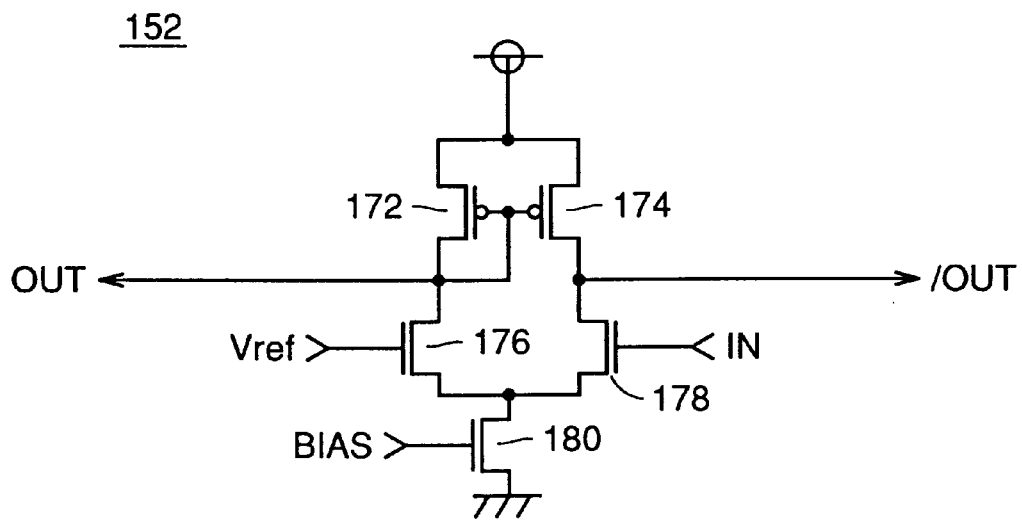
FIG. 11 is a circuit diagram showing a structure of differential amplification circuit 152 in FIG. 10.

FIG. 11 is a circuit diagram showing a structure of differential amplification circuit 152 in FIG. 10.

Referring to FIG. 11, differential amplification circuit 152 includes an N channel MOS transistor 176 which receives reference potential Vref at its gate, a P channel MOS transistor 172 which has its gate and drain connected to the drain of N channel MOS transistor 176 and its source connected to a power supply node, a P channel MOS transistor 174 which has its gate connected to the drain of N channel MOS transistor 176 and its source connected to the power supply node, an N channel MOS transistor 178 which receives input signal IN at its LId gate and is connected between the drain of P channel MOS transistor 174 and the source of N channel MOS transistor 176, and an N channel MOS transistor 180 which is connected between the source of N channel MOS transistor 176 and a ground node and receives signal BIAS at its gate.

Output signal OUT is output from the drain of N channel MOS transistor 176, and an inverted output signal /OUT which is complementary to output signal OUT is output from the drain of N channel MOS transistor 178. Differential amplification circuits 154 and 156 have a similar structure.

According to the structure as described above, the circuit size can be reduced more than in the first embodiment and similar effects to those of the first embodiment can be attained.

Third Embodiment

Figure 12:
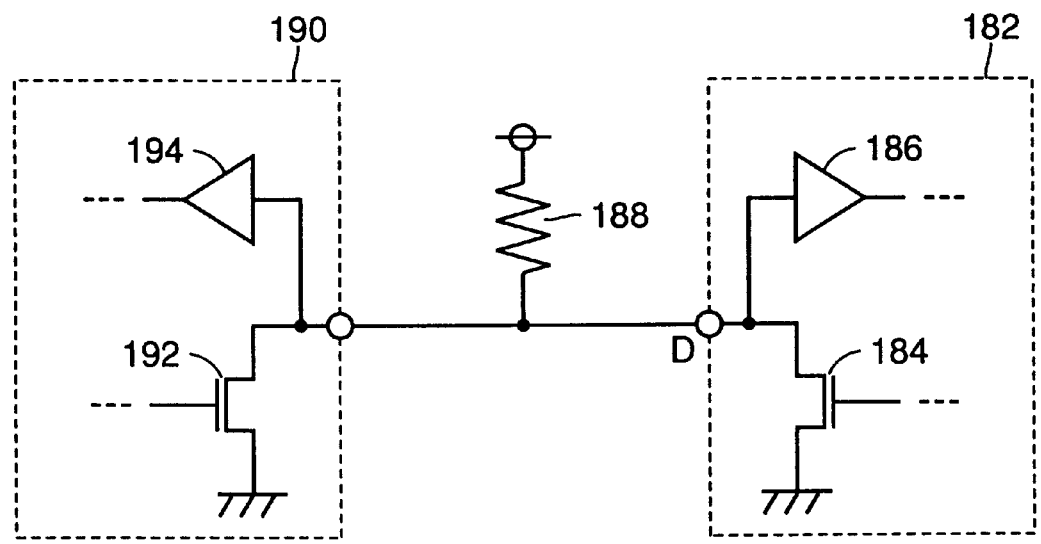
FIG. 12 is a circuit diagram showing a structure of a semiconductor device 182 in a third embodiment.

FIG. 12 is a circuit diagram showing a structure of a semiconductor device 182 in a third embodiment.

Referring to FIG. 12, semiconductor device 182 includes an input buffer 186 which receives internally data which is input from a terminal, and an N channel MOS transistor 184 which is connected between a data terminal and a ground node to drive the data terminal.

Input buffer 186 receives data according to a strobe signal as described in the first and second embodiments.

A data bus connected to the data terminal is coupled to a prescribed potential by a resistor 188. As an output used for such a data bus, an output terminal which includes only an element internally coupling the data terminal to a ground node is called an open drain terminal. Such an interface is called an open drain type interface.

The data bus is connected to another semiconductor device 190 which also includes an input buffer 194 receiving data according to a strobe signal and a transistor 192 internally coupling a terminal to the ground node.

In the open drain type interface, the data rising time is determined by resistor 188, and the data falling time is determined by transistors 184, 192. Since the data bus is discharged by an output transistor of a semiconductor device which outputs data, and the data bus is charged by resistor 188, the delay time at data rising and the delay time at data falling often differ from each other. In such an interface, it is particularly effective to select a strobe signal edge according to the polarity of data.

Fourth Embodiment

Figure 13:
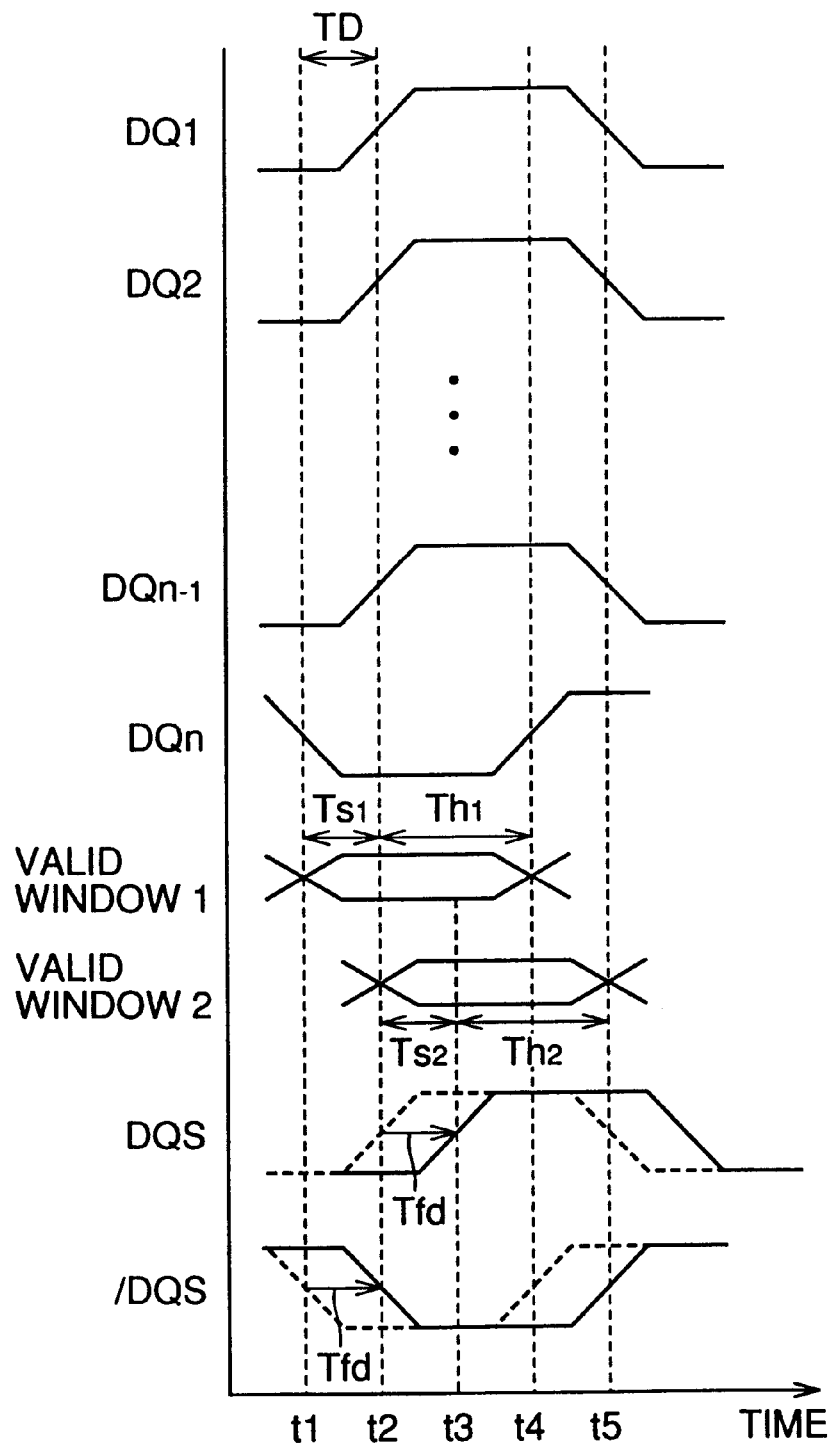
FIG. 13 is a waveform chart for illustrating a reception operation by selecting the polarity of a strobe signal according to the characteristics of data to be input.

FIG. 13 is a waveform chart for illustrating a reception operation by selecting the polarity of a strobe signal according to the characteristics of data to be input.

Figure 33:
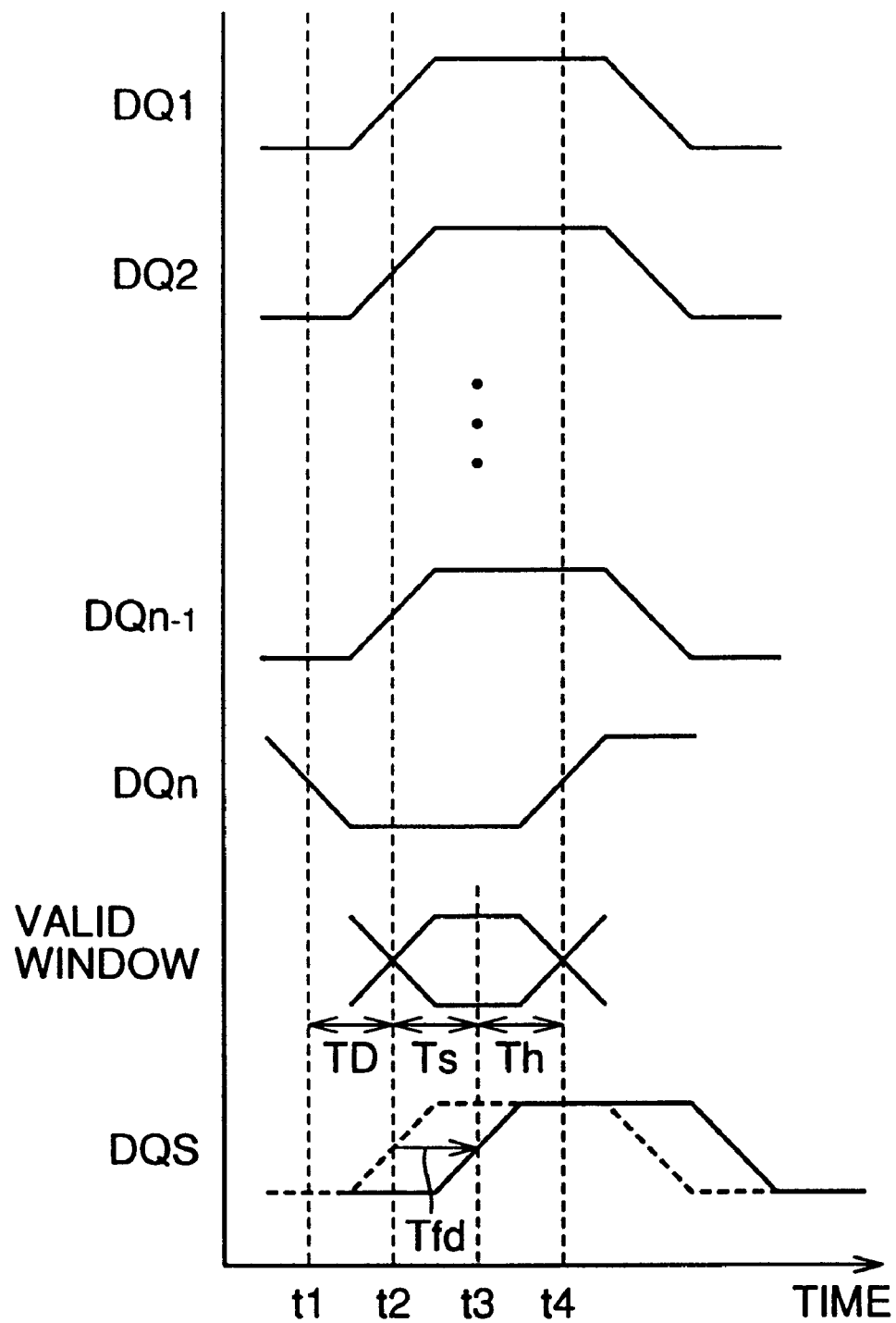
FIG. 33 is a chart for illustrating a timing margin of data with respect to a strobe signal when SSO is caused.

Referring to FIG. 13, skew TD is caused between data signals DQ1 and DQn as described with respect to FIG. 33. In order to receive effective portions of the data signals, reception edges are adapted to reach the receiving side after prescribed fixed delay time Tfd since the data signals are determined.

However, since similar skew to the case of a data signal is caused by the polarity of a strobe signal, skew TD also occurs between strobe signals DQS and /DQS.

Here, the delay time caused to the data and the strobe signal by the SSO is considered to occur almost uniformly for both due to the polarity of the data. For data signals DQ1 to DQn−1 which rises from the L level to the H level, employment of strobe signal DQS having an edge that rises from the L level to the H level correspondingly to determined data causes the time difference between time t2 when the data is determined and time t3 when a reception edge of the strobe signal is observed to be maintained almost to fixed delay time Tfd even if SSO is caused.

Data signal DQn and strobe signal /DQS which fall from the H level to the L level have a similar relation.

At time t1, data signal DQn falls from the H level to the L level. Then, at time t2, data signals DQ1 to DQn−1 rise after the period of skewTD.

In FIG. 13, since skew TD and fixed delay time Tfd occupy the exactly same period, strobe signal /DQS falls from the H level to the L level at time t2. If data signal DQn is received at the falling edge of strobe signal /DQS, the setup time is Ts1 and the hold time is Th1.

At time t3, strobe signal DQS then rises from the L level to the H level after skew time TD from strobe signal /DQS. If data signals DQ1 to DQn−1 are received at the rising edge of strobe signal DQS, the setup time is Ts2 and the hold time is Th2.

If a strobe signal to be used for reception is selected according to the polarity of data as described above, the setup time and the hold time come to have larger margins as compared with the case shown in FIG. 33.

However, it is not always necessary to select a strobe signal for reception according to the polarity of data. If data is at the L level at a certain time, a change which data to be output next brings about to the waveform is transition from the L level to the H level or continuation of the L level for the data.

If the data remains to be at the L level, the data has not changed for a period corresponding to one data before the strobe signal. Therefore, strobe signals of both polarities do not cause problems with the setup time as described above.

However, if the data makes a transition from the L level to the H level, the data should be received by using a strobe signal which changes from the L level to the H level similarly to the data as described with reference to FIG. 13.

Similarly, if the previous state of data is the H level and H level is to be output again as data, a strobe signal of any polarity may be used. When the data changes from the H level to the L level, a strobe signal to be used should also change from the H level to the L level.

Figure 14:
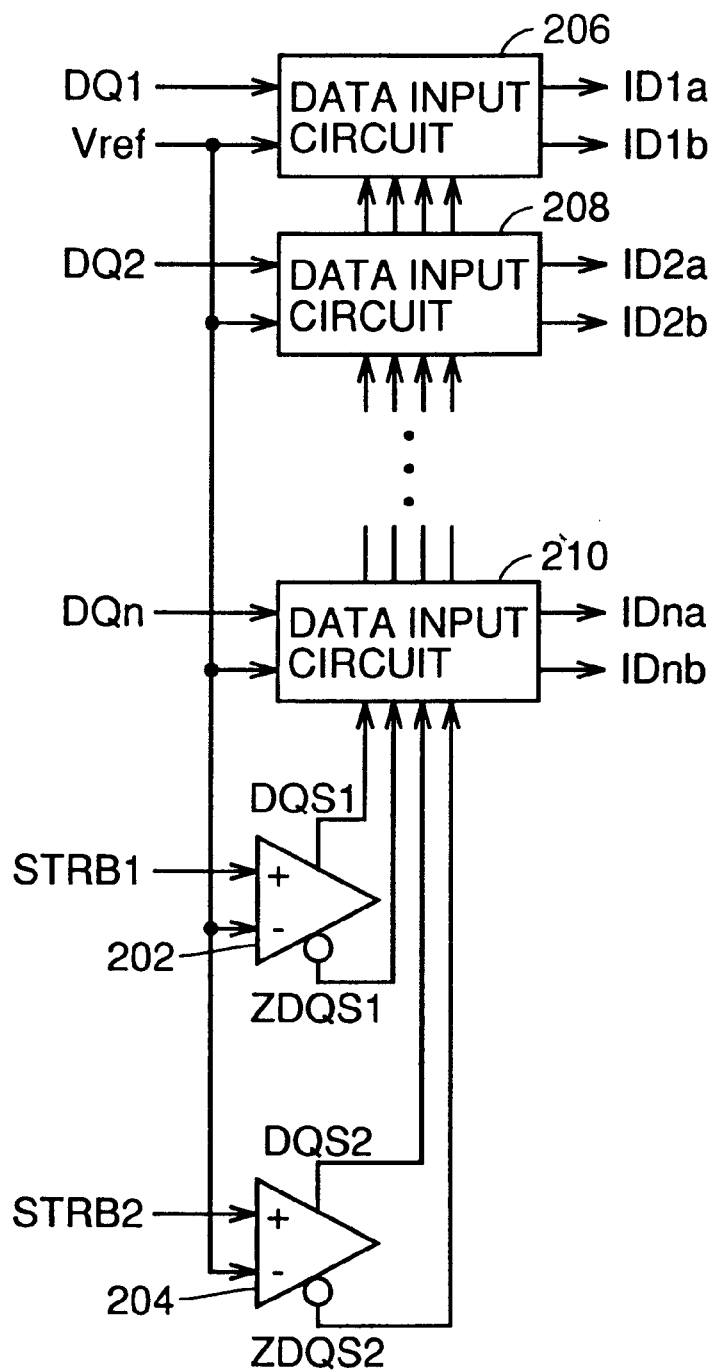
FIG. 14 is a block diagram showing a structure of an input buffer 200 in a fourth embodiment of the present invention.

FIG. 14 is a block diagram showing a structure of an input buffer 200 in a fourth embodiment.

Referring to FIG. 14, input buffer 200 includes a differential amplification circuit 202 which receives strobe signal STRB1 and reference potential Vref and outputs complementary strobe signals DQS1, ZDQS1, a differential amplification circuit 204 which receives strobe signal STBR2 and reference potential Vref and outputs complementary strobe signals DQS2, ZDQS2, and data input circuits 206 to 210 each of which receives reference potential Vref at its first input and one of data signals DQ1 to DQn at its second input. Data input circuits 206 to 210 receive data according to four strobe signals DQS1, ZDQS1, DQS2, ZDQS2 and output internal data signals ID 1a, ID 1b to IDna, IDnb, respectively.

Since differential amplification circuits 202, 204 have a similar structure to that of differential amplification circuit 152 shown in FIG. 11, description thereof will not be repeated.

Figure 15:
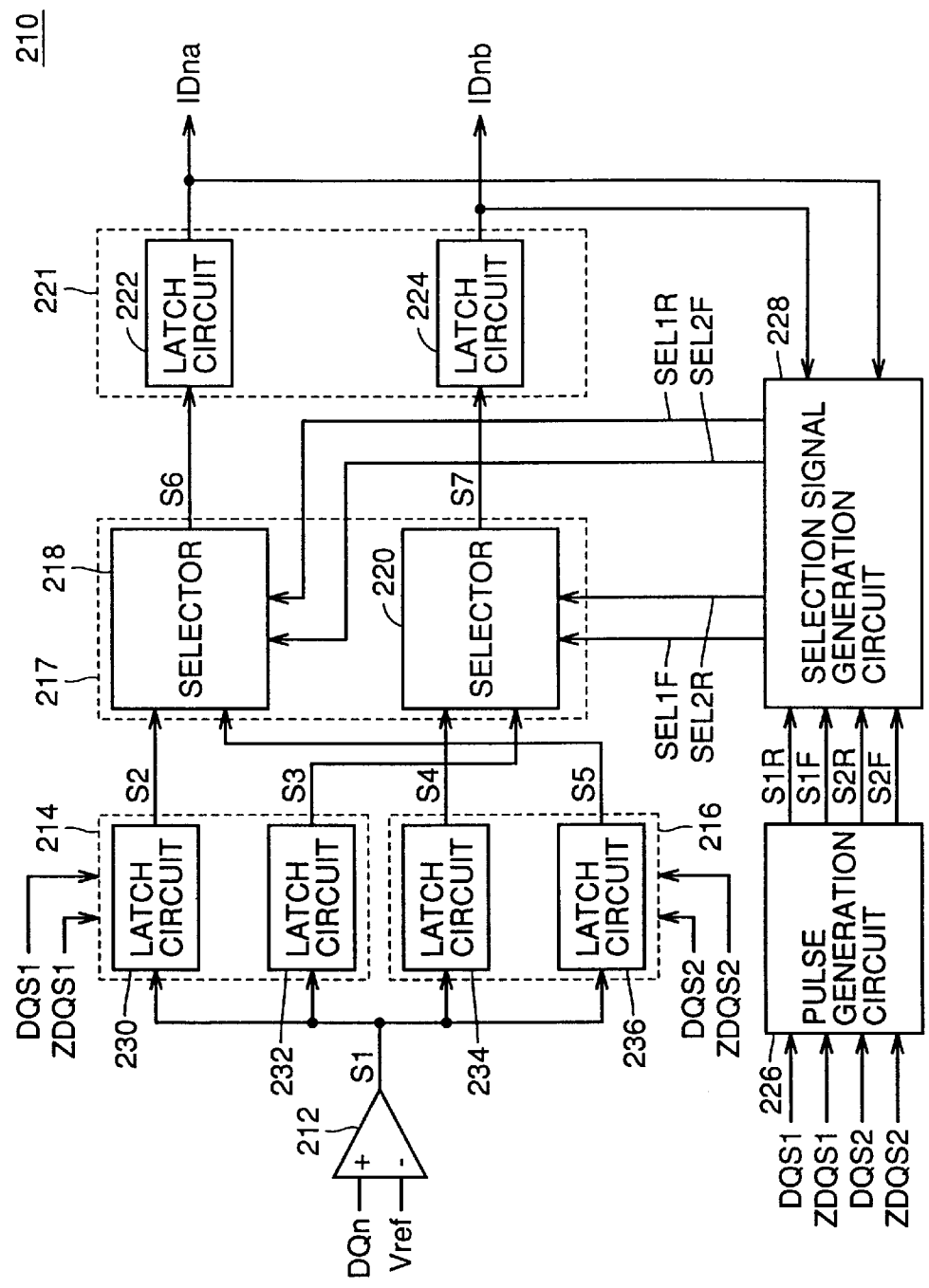
FIG. 15 is a block diagram showing a structure of data input circuit 210 shown in FIG. 14.

FIG. 15 is a block diagram showing a structure of data input circuit 210 shown in FIG. 14.

Referring to FIG. 15, data input circuit 210 includes a differential amplification circuit 212 which receives data signal DQn and reference potential Vref and outputs a signal S1, a latch circuit 214 which receives signal Si according to strobe signals DQS1, ZDQS1, a latch circuit 216 which receives signal S1 according to strobe signals DQS2, ZDQS2, a selector 217 which receives an output of latch circuit 214 and an output of latch circuit 216 and outputs one of them, and a latch circuit 221 which maintains the output of selector 217 and outputs it as internal data signals IDna, IDnb.

Data input circuit 210 further includes a pulse generation circuit 226 which receives strobe signals DQS1, ZDQS1, DQS2, ZDQS2 and generates pulse signals at respective waveform edges, and a selection signal generation circuit 228 which receives an output of pulse generation circuit 226 and internal data signals IDna, IDnb and outputs selection signals SEL1R, SEL2F, SEL1F, SEL2R.

Selector 217 includes a selector 218 which receives a signal S2 output from latch circuit 214 and a signal S5 output from latch circuit 216 and outputs one of them as a signal 86 according to selection signals SEL1R, SEL2F, and a selector 220 which receives a signal S3 output from latch circuit 214 and a signal S4 output from latch circuit 216 and outputs one of them as a signal S7 according to selection signals SEL1F, SEL2R.

Latch circuit 221 includes a latch circuit 222 which maintains signal S6 and outputs it as internal data signal IDna, and a latch circuit 224 which maintains signal S7 and outputs it as internal data signal IDnb.

Figure 16:
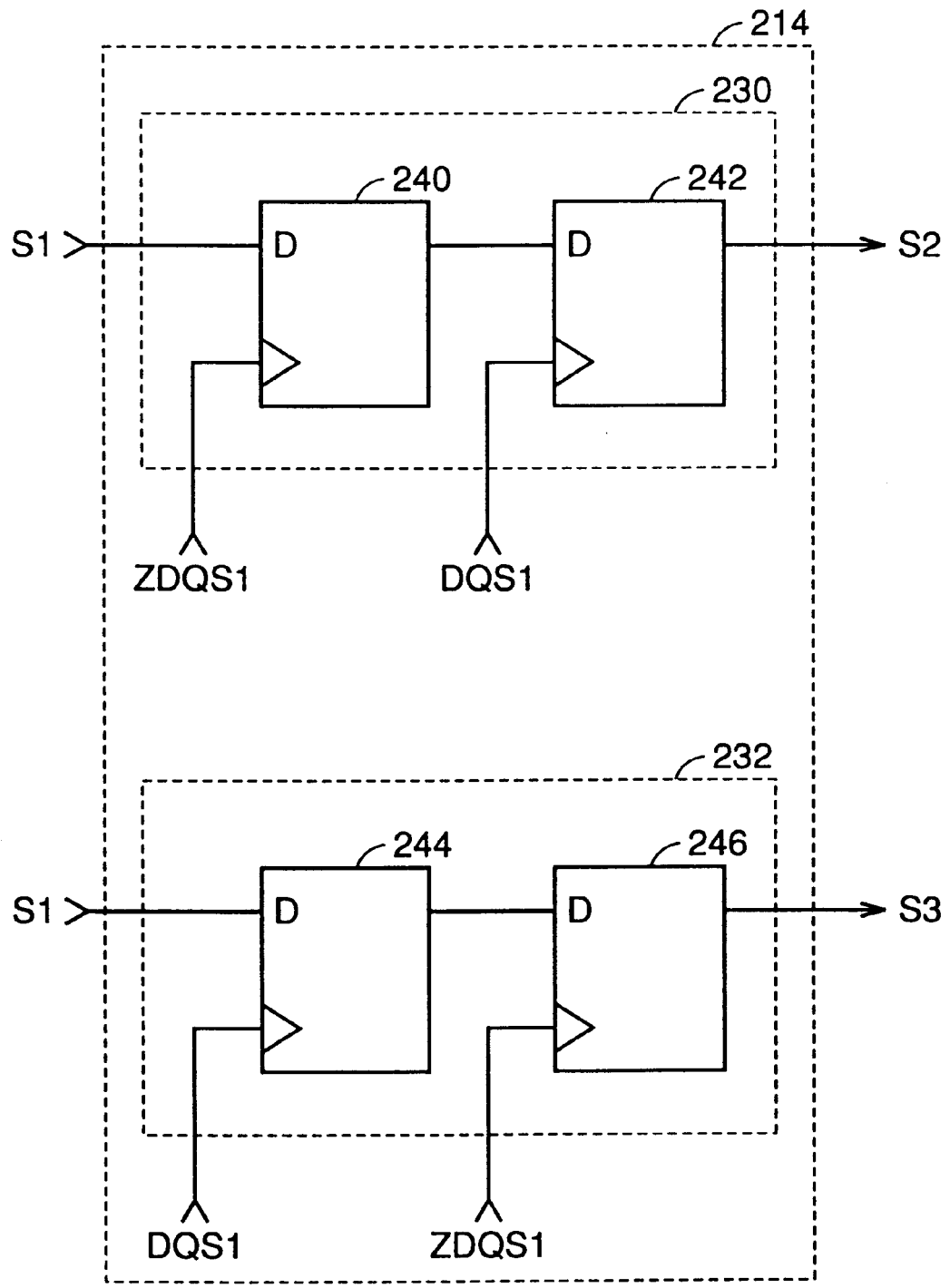
FIG. 16 is a circuit diagram showing a structure of latch circuit 214 in FIG. 15.

FIG. 16 is a circuit diagram showing a structure of latch circuit 214 in FIG. 15

Referring to FIG. 16, latch circuit 214 includes a latch circuit 230 which receives signal S1 and outputs signal S2, and a latch circuit 232 which receives signal S1 and outputs signal S3.

Latch circuit 230 includes a D flip-flop 240 which receives signal S1 according to strobe signal ZDQ1, and a D flip-flop 242 which receives an output of D flip-flop 240 according to strobe signal DQS1. D flip-flop 242 outputs signal S2.

Latch circuit 232 includes a D flip-flop 244 which receives signal S1 according to strobe signal DQS1, and a D flip-flop 246 which receives an output of D flip-flop 244 according to strobe signal ZDQS1. D flip-flop 246 outputs signal S3.

Figure 17:
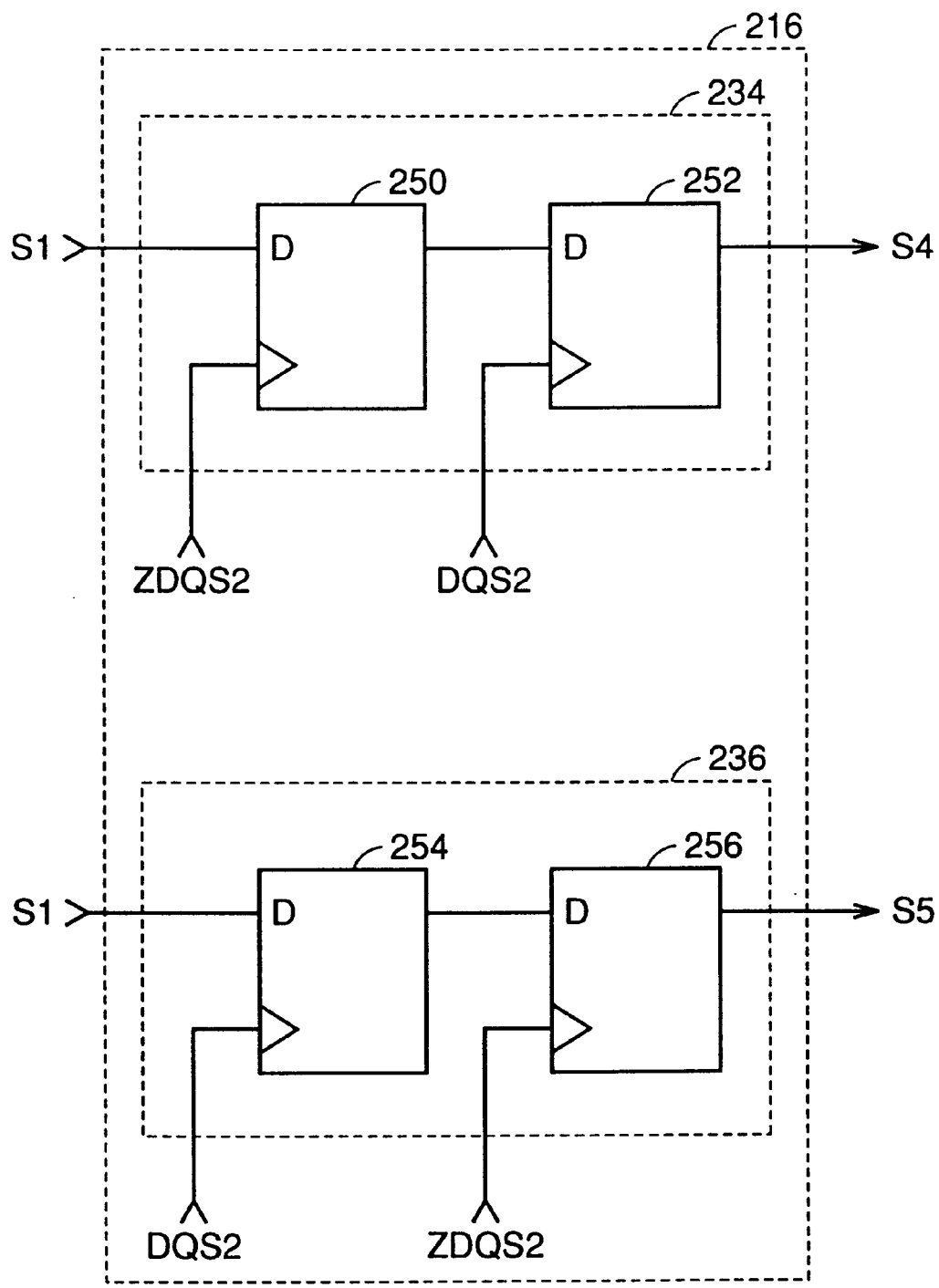
FIG. 17 is a circuit diagram showing a structure of latch circuit 216 in FIG. 15.

FIG. 17 is a circuit diagram showing a structure of latch circuit 216 in FIG. 15.

Referring to FIG. 17, latch circuit 216 includes a latch circuit 234 which receives signal S1 and outputs signal S4, and a latch circuit 236 which receives signal S1 and outputs signal S5.

Latch circuit 234 includes a D flip-flop 250 which receives signal S1 according to strobe signal ZDQS2, and a D flip-flop 252 which receives an output of D flip-flop 250 according to strobe signal DQS2. D flip-flop 252 outputs signal S4.

Latch circuit 236 includes a D flip-flop 254 which receives signal S1 according to strobe signal DQS2, and a D flip-flop 256 which receives an output of D flip-flop 254 according to strobe signal ZDQS2. D flip-flop 256 outputs signal S5.

Figure 18:
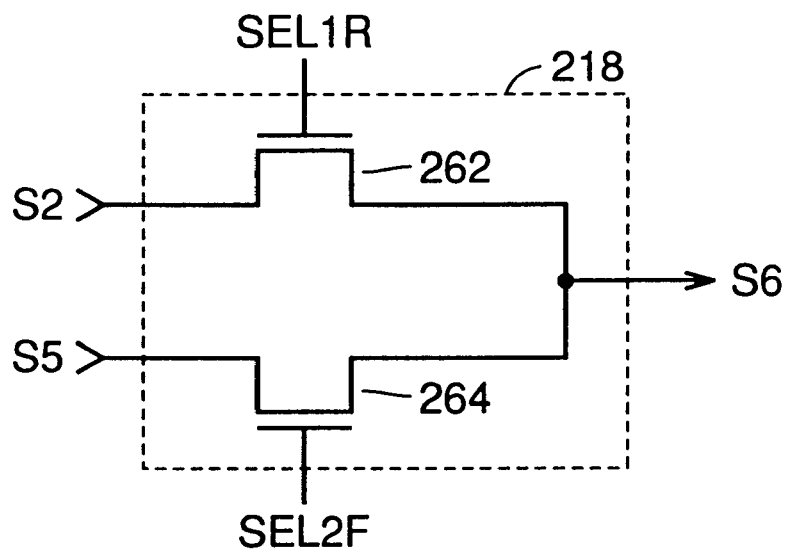
FIG. 18 is a circuit diagram showing a structure of selector 218 in FIG. 15.

FIG. 18 is a circuit diagram showing a structure of selector 218 in FIG. 15.

Referring to FIG. 18, selector 218 includes an N channel MOS transistor 262 rendered conductive according to selection signal SEL1R for outputting signal S2 as signal S6, and an N channel MOS transistor 264 rendered conductive according to selection signal SEL2F for outputting signal S5 as signal 86.

Figure 19:
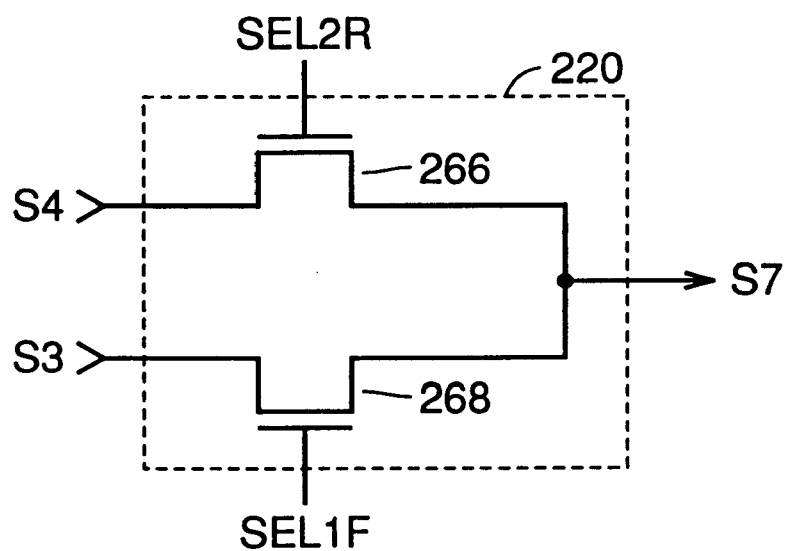
FIG. 19 is a circuit diagram showing a structure of selector 220 in FIG. 15.

FIG. 19 is a circuit diagram showing a structure of selector 220 in FIG. 15.

Referring to FIG. 19, selector 220 includes an N channel MOS transistor 266 rendered conductive according to selection signal SEL2R for outputting signal S4 as signal S7, and an N channel MOS transistor 268 rendered conductive according to selection signal SEL1F for outputting signal S3 as signal S7.

Figure 20:
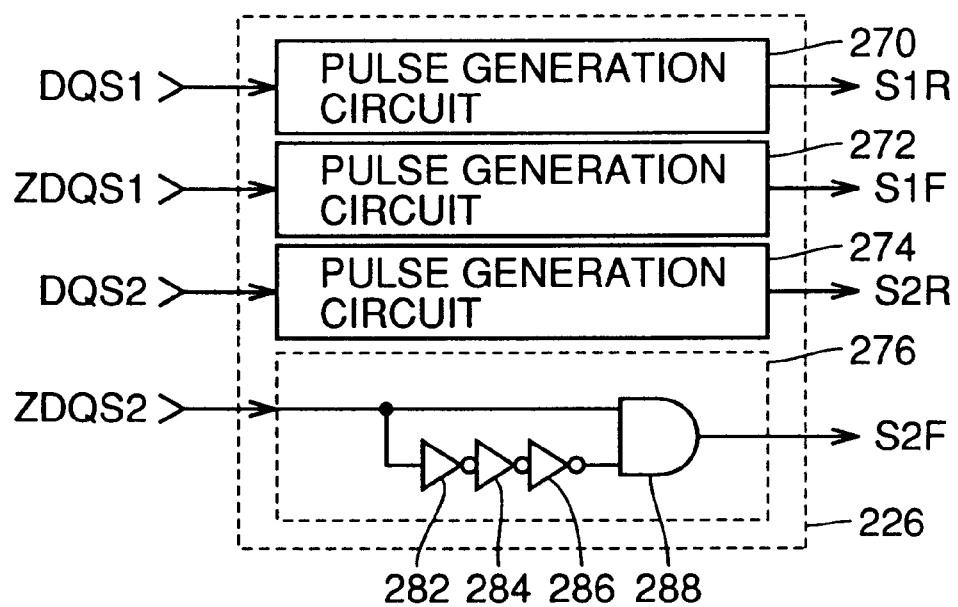
FIG. 20 is a circuit diagram showing a structure of pulse generation circuit 226 in FIG. 15.

FIG. 20 is a circuit diagram showing a structure of pulse generation circuit 226 in FIG. 15.

Referring to FIG. 20, pulse generation circuit 226 includes a pulse generation circuit 270 which receives strobe signal DQS1 and outputs a pulse signal S1R, a pulse generation circuit 272 which receives strobe signal ZDQS 1 and outputs a pulse signal S1F, a pulse generation circuit 274 which receives strobe signal DQS2 and outputs a pulse signal S2R, and a pulse generation circuit 276 which receives strobe signal ZDQS2 and outputs a pulse signal S2F.

Pulse generation circuit 276 includes serially connected inverters 282, 284, 286 which receive strobe signal ZDQS2, and an AND circuit 288 which receives an output of inverter 286 and strobe signal ZDQS2. AND circuit 288 outputs pulse signal S2F.

Since pulse generation circuits 270, 272, 274 have a similar structure to pulse generation circuit 276, description thereof will not be repeated.

Figure 21:
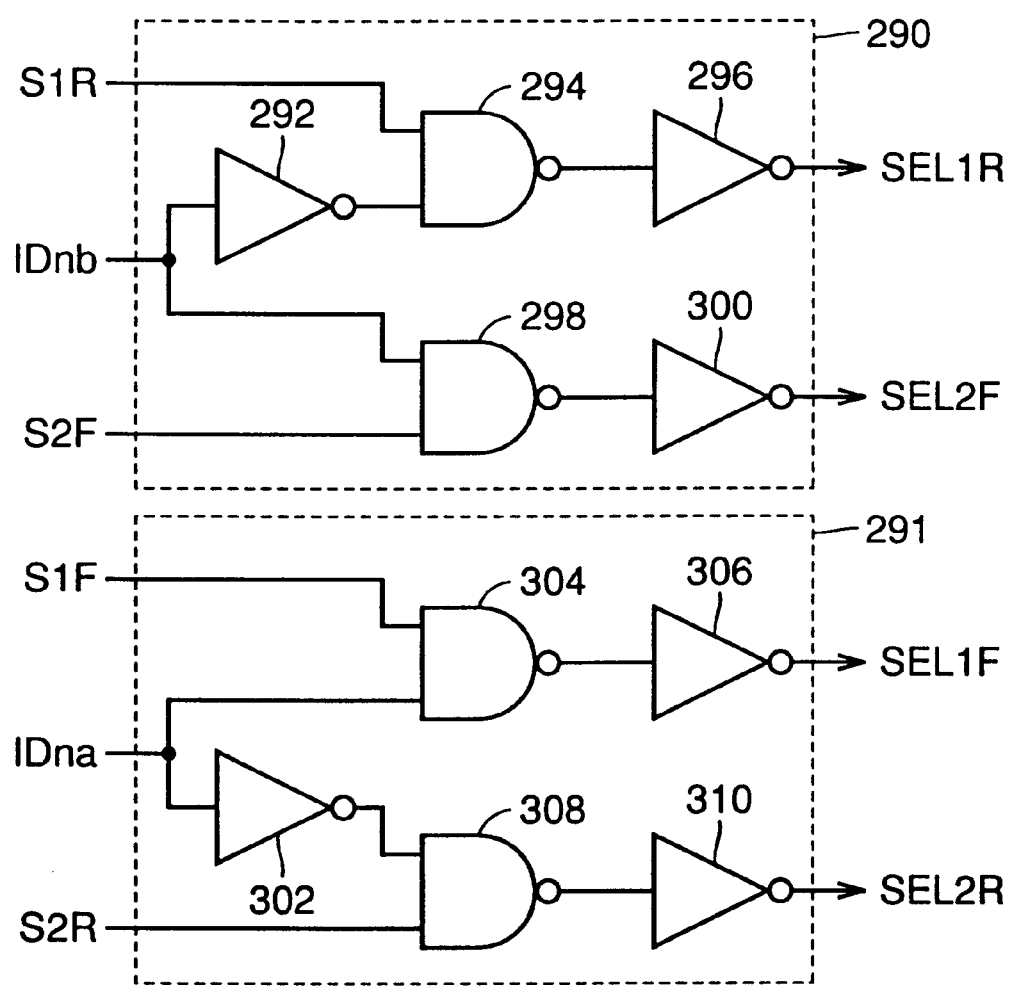
FIG. 21 is a circuit diagram showing a structure of selection signal generation circuit 228 in FIG. 15.

FIG. 21 is a circuit diagram showing a structure of selection signal generation circuit 228 in FIG. 15.

Referring to FIG. 21, selection signal generation circuit 228 includes a gate circuit 290 which selectively outputs one of pulse signals SIR, S2F according to internal data signal IDnb, and a gate circuit 291 which selectively outputs one of pulse signals S1F, S2R according to internal data signal IDna.

Gate circuit 290 includes an inverter 292 which receives internal data signal IDnb, an NAND circuit 294 which receives pulse signal SiR and an output of inverter 292, an inverter 296 which receives and inverts an output of NAND circuit 294 and outputs selection signal SEL1R, an NAND circuit 298 which receives internal data signal IDnb and pulse signal S2F, and an inverter 300 which receives and inverts an output of NAND circuit 298 and outputs selection signal SEL2F.

Gate circuit 291 includes an inverter 302 which receives and inverts internal data signal IDna, an NAND circuit 304 which receives pulse signal SIF and internal data signal IDna, an inverter 306 which receives and inverts an output of NAND circuit 304 and outputs selection signal SEL1F, an NAND circuit 308 which receives an output of inverter 302 and pulse signal S2R, and an inverter 310 which receives and inverts an output of NAND circuit 308 and outputs selection signal SEL2R.

When internal data signals IDna, IDnb are at the H level, selection signal generation circuit 228 selects a strobe signal, which falls from the H level to the L level, to be used for data reception in preparation for a case where L level data for which skew is problematic is received next. S1F, S2F are pulse signals which are generated according to falling of strobe signals STRB1, STRB2, respectively. These pulse signals are selected when previously held internal data signals IDna, IDnb are at the H level.

On the other hand, when data signals IDna, IDnb are at the L level, selection signal generation circuit 228 selects a strobe signal, which rises from the L level to the H level, to be used for data reception in preparation for a case where H level data for which skew is problematic is received next. S1R, S2R are pulse signals which are generated according to rising of strobe signals STRB1, STRB2, respectively. These pulse signals are selected when previously held internal data signals IDna, IDnb are at the L level.

Figure 22:
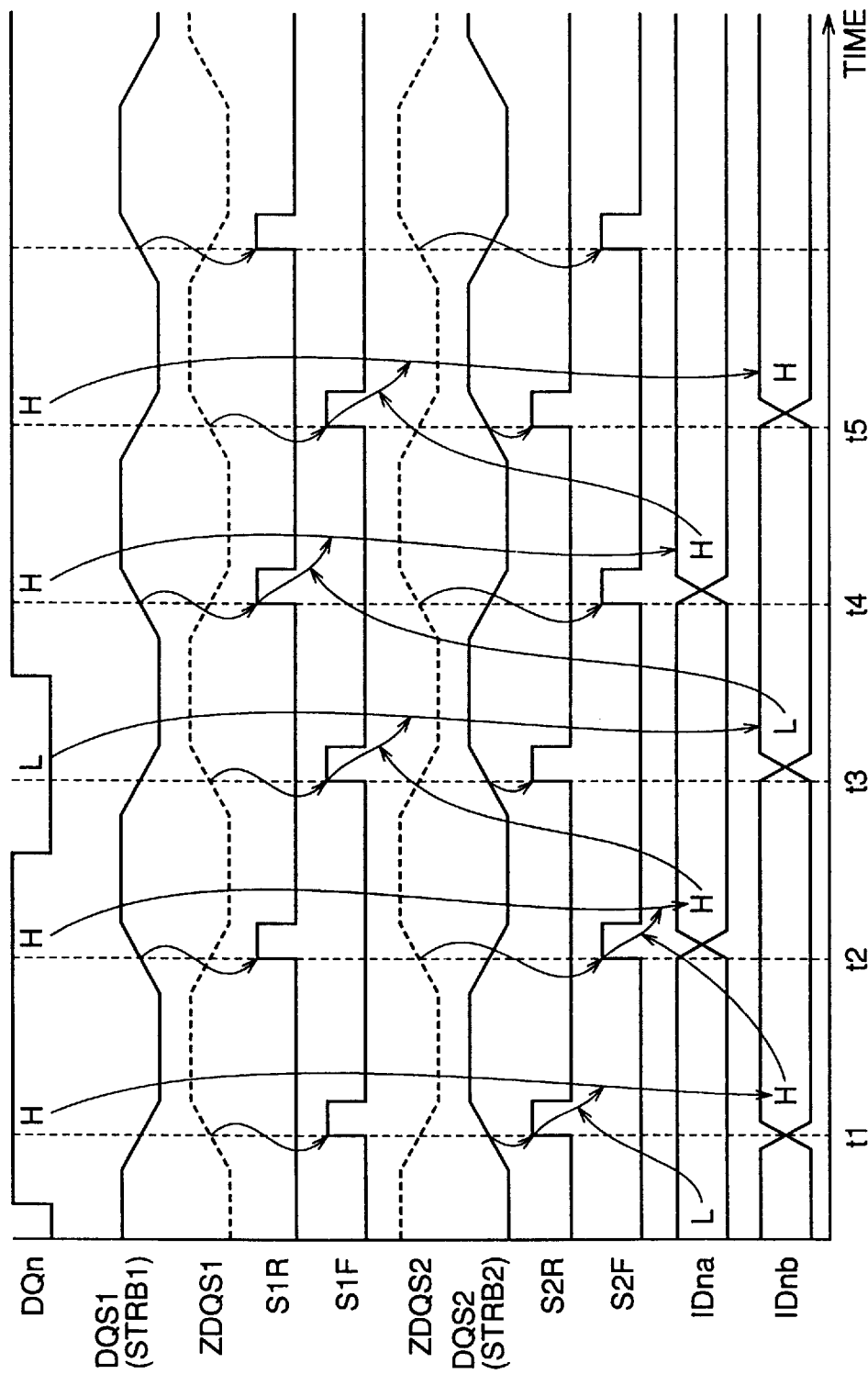
FIG. 22 is an operational waveform chart for illustrating an operation of the input buffer in the semiconductor device in the fourth embodiment.

FIG. 22 is an operational waveform chart for illustrating an operation of the input buffer in the semiconductor device in the fourth embodiment.

Referring to FIGS. 15 and 22, data input circuit 210 is a data input circuit which serial-to-parallel converts externally input data signal DQn to 2-bit internal data signals IDna, IDnb and outputs the converted signals.

At time t1, assume that internal data signal IDna of data input circuit 210 is at the L level, H level data signal DQn which is received is held by latch 224, and internal data signal IDnb attains the H level.

It is found out by referring to internal data signal IDnb that data signal DQn which is received at time t1 is at the H level. In this case, a signal which is used as the strobe signal at time t2 when the data signal is received next is a strobe signal which falls from the H level to the L level. Therefore, selection signal generation circuit 228 shown in FIG. 21 activates selection signal SEL2F by pulse signal S2F. Thus, selector 218 shown in FIG. 18 outputs signal S5 to latch circuit 222.

Signal S5 is a signal which is latched by latch circuit 236. At time t2, latch circuit 236 receives signals S1 according to strobe signal ZDQS2, that is, in response to strobe signal STRB2 falling from the H level to the L level, and holds H data. Therefore, selector 218 outputs the H data and thus internal data signal IDna changes from the L level to the H level.

In the following, reception of data signal DQn at time t3 will be described. It is found out by referring to internal data signal IDna that data signal DQn which is received at time t2 is at the H level. In this case, a signal which is used as the strobe signal at time t3 when the data signal is received next is a strobe signal which falls from the H level to the L level. Therefore, selection signal generation circuit 228 shown in FIG. 21 activates selection signal SEL1F by pulse signal S1F. Thus, selector 220 shown in FIG. 19 transmits signal S3 to latch circuit 224. At time t3, signal S3 is received by latch circuit 232 according to strobe signal ZDQS1, that is, in response to strobe signal STRB1 falling from the H level to the L level. Therefore, the margin will not be reduced by skew.

Similarly, since internal data signal IDnb which is received at time t3 and held in latch 224 is at the L level, signal S2 which is latched by latch circuit 230 in response to strobe signal STRB1 rising from the L level to the H level becomes internal data signal IDna at time t4. In addition, since internal data signal IDna which is received at time t4 and held in latch circuit 222 is at the H level, signal S3 which is latched by latch circuit 232 in response to strobe signal STRB1 falling from the H level to the L level becomes internal data signal IDnb at time t5.

Although data reception has been described above, there is a point to be taken into account, that is, how to deal with head data hen data output is started during burst read and burst write in a ynchronous DRAM. The previous state is naturally not determined for the head data which has not been output yet.

Figure 23:
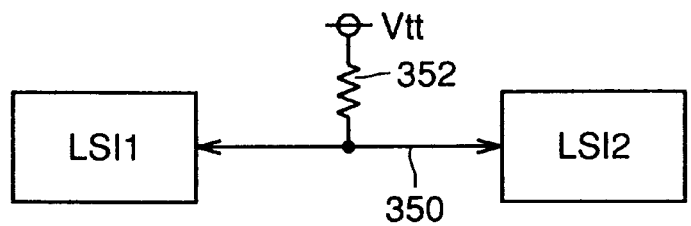
FIG. 23 is a diagram for illustrating a data bus for carrying out data transmission in the semiconductor device.

FIG. 23 is a diagram for illustrating a data bus for transmitting data of a semiconductor device.

Referring to FIG. 23, data transmission between semiconductor devices LSI1 and LSI2 is performed by a data bus 350. In this case, data bus 350 is usually coupled to a prescribed fixed potential Vtt through a resistor 352. Therefore, when both semiconductors LSI1, LSI2 do not output data to the data bus, the potential of data bus 350 is fixed potential Vtt.

For general DRAMs, however, fixed potential Vtt is often set to an intermediate potential between the potentials of the H and L levels of data, it is necessary to forcibly determine the previous state before outputting data which corresponds to a burst length. In other words, the standby potential of data prior to start of a burst operation needs to be set to the L level or the H level. A portion in which data prior to start of the burst operation is set in this manner is generally called a preamble. It is therefore necessary to provide an output buffer circuit for outputting a preamble before outputting effective data during a burst operation.

Figure 24:
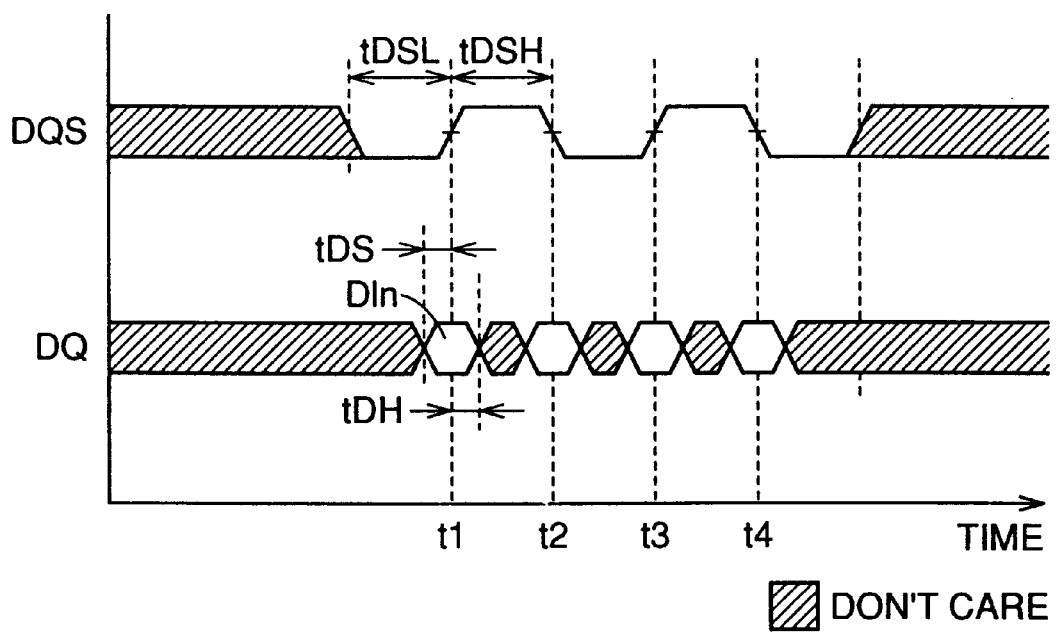
FIG. 24 is a chart for illustrating relations between a strobe signal DQS of a general DDR (double data rate) synchronous DRAM and a data signal DQ.

FIG. 24 is a chart showing relations between a strobe signal DQS of a general DDR (double data rate) synchronous DRAM and a data signal DQ.

As can be seen from FIG. 24, strobe signal DQS is determined to the L level before head data at the time of a burst output operation. In other words, strobe signal DQS has to be determined to the L level such a time period that corresponds to tDSL before the timing at which the head data is received at time t1. Therefore, when a semiconductor device outputs a data signal as well, an L level preamble provided by strobe signal DQS may be added to the data signal.

Figure 25:
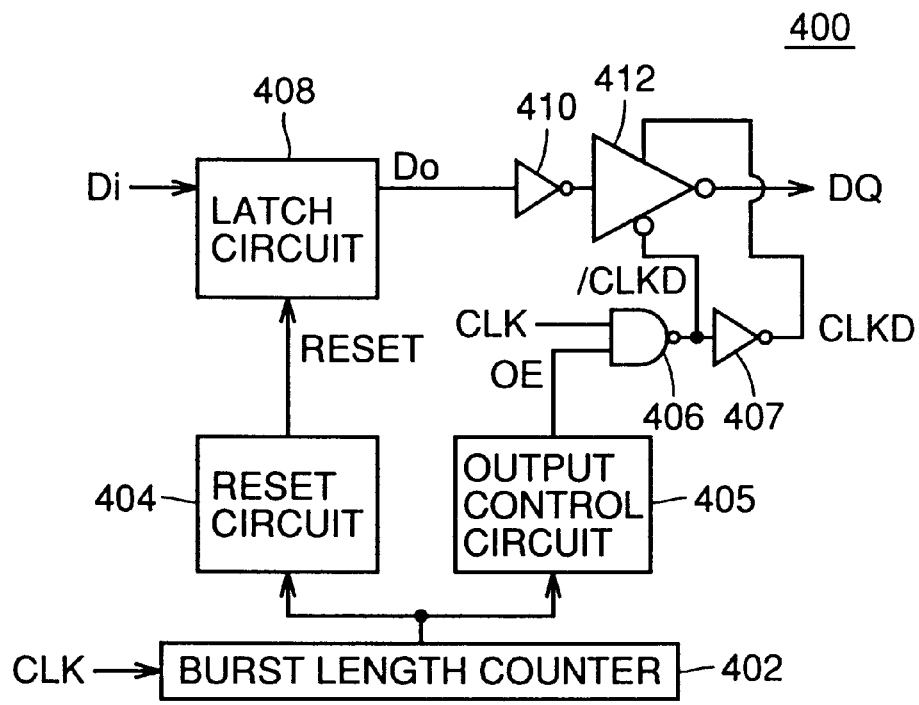
FIG. 25 is a circuit diagram showing a structure of an output buffer 400 for outputting a preamble.

FIG. 25 is a circuit diagram showing a structure of an output buffer 400 for outputting a preamble.

Referring to FIG. 25, output buffer 400 includes a burst length counter 402 which receives a clock signal CLK and counts time that corresponds to a burst length, a reset circuit 404 which outputs a reset signal RESET according to the count value of the burst length counter, an output control circuit 405 which outputs an output control signal OE according to the count value of the burst length counter, an NAND circuit 406 which receives output control signal OE and clock signal CLK and outputs an output clock signal /CLKD, and an inverter 407 which receives and inverts output clock signal /CLKD and outputs an output clock signal CLKD.

Output buffer 400 further includes a latch circuit 408 of which output is reset to the L level according to reset signal RESET and which receives and holds an internal data signal Di, an inverter 410 which receives and inverts an output signal Do of the latch circuit, and a clocked inverter 412 which is activated according to output clock signals CLKD, /CLKD and which inverts an output of inverter 410 and outputs it as data signal DQ to an external terminal.

Although the output of clocked inverter 412 is generally connected to a data input/output terminal DQ when output buffer 400 in FIG. 25 is used for output buffer 20 in FIG. 1, it is connected to an output terminal when input and output terminals are disconnected.

Figure 26:
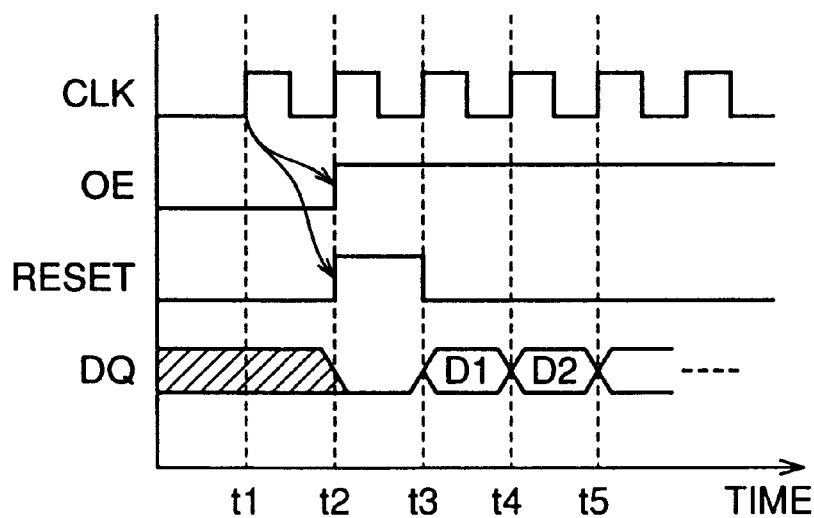
FIG. 26 is an operational waveform chart for illustrating an operation of output buffer 400.

FIG. 26 is an operational waveform chart for illustrating an operation of output buffer 400.

Referring to FIGS. 25 and 26, the clock signal is input to burst length counter 402 at time t1, and reset circuit 404 activates reset signal RESET according to the count value of burst length counter 404 from time t2 to time t3. Thus, latch circuit 408 is reset and output signal Do attains the L level. At this time, output control circuit 405 activates output control signal OE, and therefore output signal Do which is at the L level is supplied as an output by inverter 410 and clocked inverter 412 and data signal DQ attains the L level.

Thereafter, at time t3, reset circuit 404 resets reset signal RESET, data D1 is input to latch circuit 408, and data D1 is supplied as an output by inverter 410 and clocked inverter 412.

Thereafter, at time t4, data D2 is input for internal data signal Di, and data D2 is supplied as an output in a similar manner. Thus, the L level preamble can be added as the previous state of effective data to data signal DQ.

Figure 27:
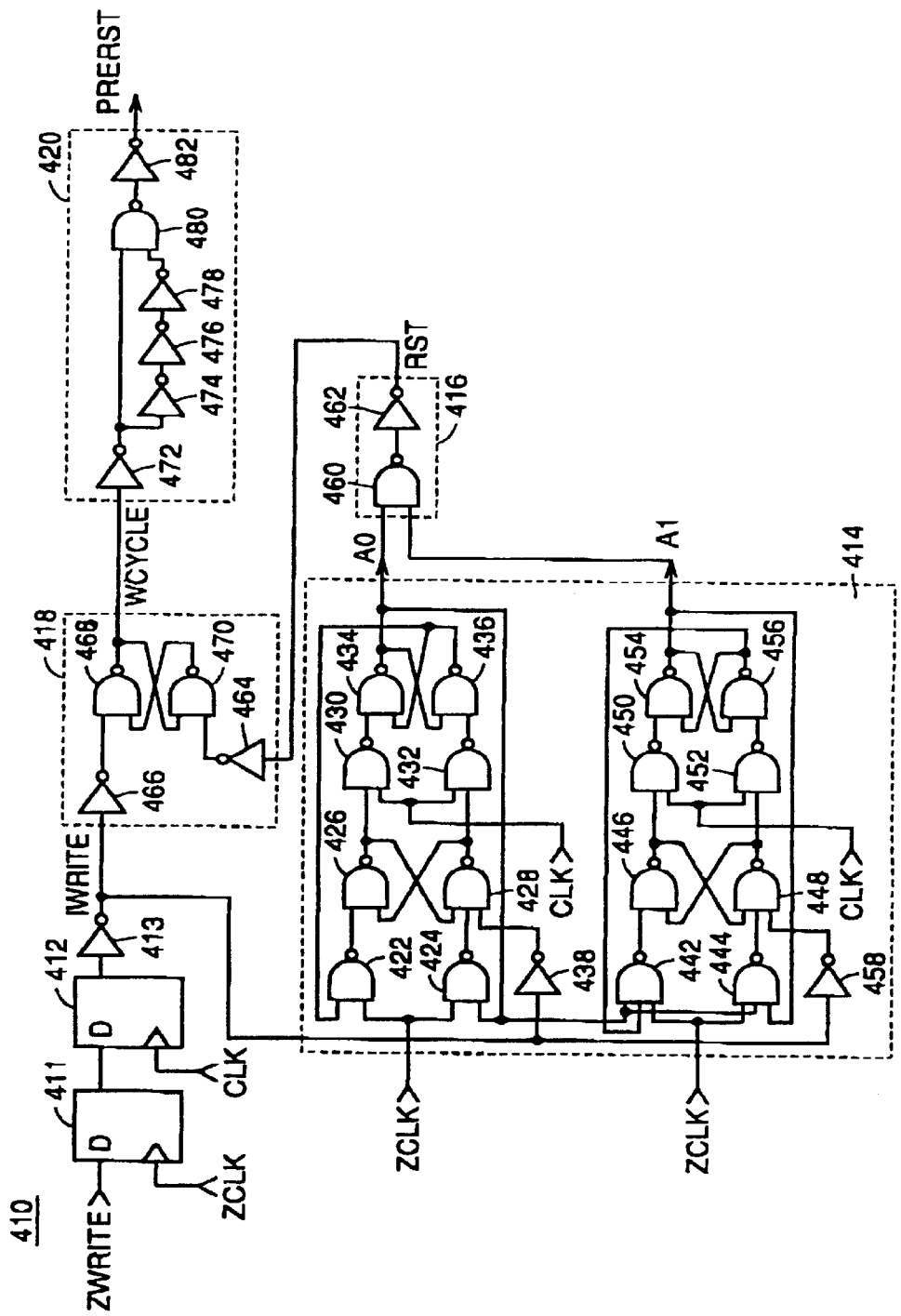
FIG. 27 is a circuit diagram showing a structure of a preset circuit 410 provided in a semiconductor device for receiving data with an added preamble.

FIG. 27 is a circuit diagram showing a structure of a preset circuit 410 which is provided in a semiconductor device for receiving data with an added preamble.

Referring to FIG. 27, preset circuit 410 includes a D flip-flop 411 which receives a write instruction signal ZWRITE in synchronization with a clock signal ZCLK, a D flip-flop 412 which receives an output of D flip-flop 411 in synchronization with clock signal CLK, an inverter 413 which receives and inverts an output of D flip-flop 412 and outputs an internal write signal IWRITE, a 2BIT counter 414 which counts writing cycles after reception of internal write signal IWRITE according to clock signals CLK, ZCLK, a gate circuit 416 which outputs a reset pulse RST when both count values A0, A1 output from 2BIT counter 414 assume "1," a latch circuit 418 which is set by internal write signal IWRITE, is reset by reset signal RST and outputs a signal WCYCLE, and a pulse generation circuit 420 which receives signal WCYCLE, detects a falling edge and outputs a pulse signal PRERST.

2BIT counter 414 includes an inverter 438 which receives and inverts internal write signal IWRITE, an NAND circuit 422 which receives clock signal ZCLK at its one input, an NAND circuit 424 which receives clock signal ZCLK and signal A0, and cross-coupled NAND circuits 426, 428. NAND circuit 428 which is a 3-input NAND circuit receives an output of inverter 438 and an output of NAND circuit 424 at its second and third inputs, respectively. NAND circuit 426 which is a 2-input NAND circuit receives an output of NAND circuit 422 at its second input.

2BIT counter 414 further includes an NAND circuit 430 which receives clock signal CLK and an output of NAND circuit 426, an NAND circuit 432 which receives clock signal CLK and an output of NAND circuit 428, and cross-coupled NAND circuits 434, 436. NAND circuit 434 which is a 2-input NAND circuit receives an output of NAND circuit 430 at its second input. NAND circuit 436 which is a 2-input NAND circuit receives an output of NAND circuit 432 at its second input. NAND circuit 434 outputs signal A0, and an output of NAND circuit 436 is applied to the second input of NAND circuit 422.

2BIT counter 414 further includes an inverter 458 which receives and inverts internal write signal IWRITE, a 3-input NAND circuit 442 which receives clock signal ZCLK and signal A0 at its first and second inputs, an NAND circuit 444 which receives clock signal ZCLK, signal A0 and signal A1, and cross-coupled NAND circuits 446, 448. NAND circuit 448 which is a 3-input NAND circuit receives an output of inverter 458 and an output of NAND circuit 444 at its second and third inputs, respectively. NAND circuit 446 which is a 2-input NAND circuit receives an output of NAND circuit 442 at its second input.

2BIT counter 414 further includes an NAND circuit 450 which receives clock signal CLK and an output of NAND circuit 446, an NAND circuit 452 which receives clock signal CLK and an output of NAND circuit 448, and cross-coupled NAND circuits 454, 456. NAND circuit 454 which is a 2-input NAND circuit receives an output of NAND circuit 450 at its second input. NAND circuit 456 which is a 2-input NAND circuit receives an output of NAND circuit 452 at its second input. NAND circuit 454 outputs signal A1, and an output of NAND circuit 456 is applied to the third input of NAND circuit 442.

Gate circuit 416 includes an NAND circuit 460 which receives signals A0, A1, and an inverter 462 which receives and inverts an output of NAND circuit 460 and outputs reset signal RST.

Latch circuit 418 includes an inverter 466 which receives and inverts internal write signal IWRITE, an inverter 464 which receives and inverts reset signal RST, and cross-coupled NAND circuits 468, 470 which receive outputs of inverters 466, 464, respectively. NAND circuit 468 outputs signal WCYCLE.

Pulse generation circuit 420 includes an inverter 472 which receives and inverts signal WCYCLE, serially connected inverters 474, 476, 478 which receive an output of inverter 472, an NAND circuit 480 which receives outputs of inverters 472, 478, and an inverter 482 which receives and inverts an output of NAND circuit 480 and outputs pulse signal PRERST.

Figure 28:
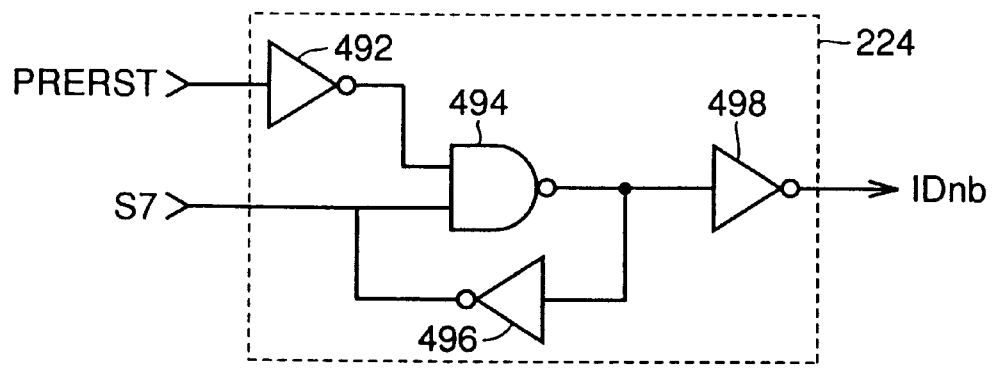
FIG. 28 is a circuit diagram showing a structure of latch circuit 224 shown in FIG. 15.

FIG. 28 is a circuit diagram showing a structure of latch circuit 224 shown in FIG. 15.

Referring to FIG. 28, latch circuit 224 includes an inverter 492 which receives and inverts pulse signal PRERST, an NAND circuit 494 which receives signal S7 and an output of inverter 492, an inverter 496 which receives an output of NAND circuit 494 and feeds it back to signal S7, and an inverter 498 which receives and inverts an output of NAND circuit 494 and outputs internal data signal IDnb.

Figure 29:
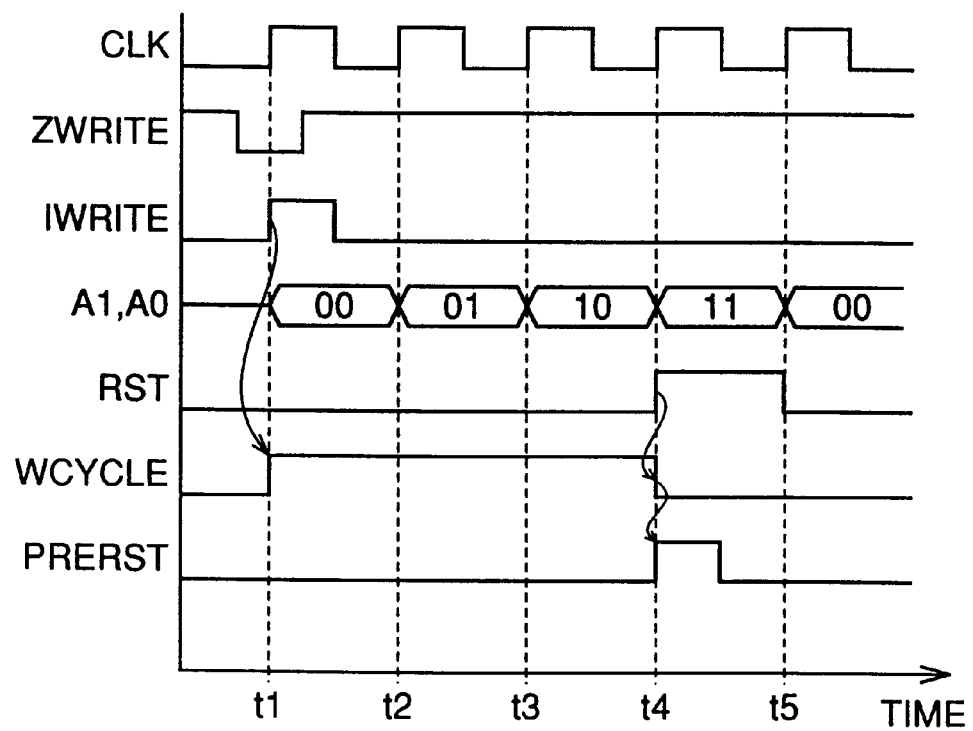
FIG. 29 is an operational waveform chart for illustrating operations of preset circuit 410 and latch circuit 224.
Figure 30:
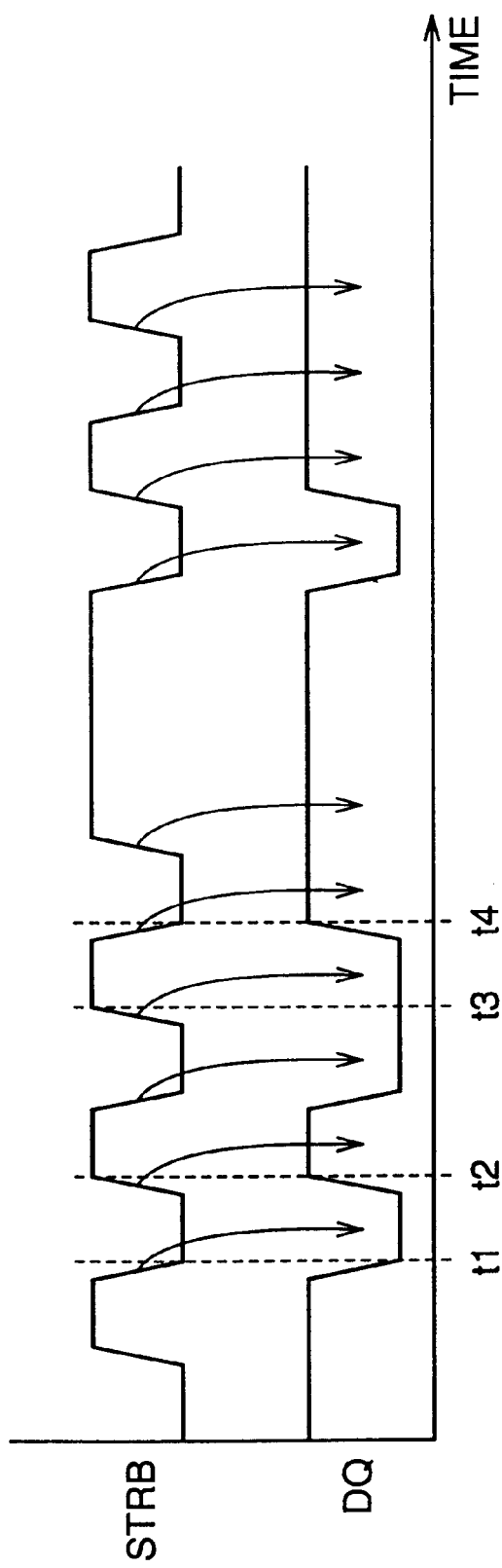
FIG. 30 is a waveform chart for illustrating relations between a conventional data strobe signal and data.
Figure 31:
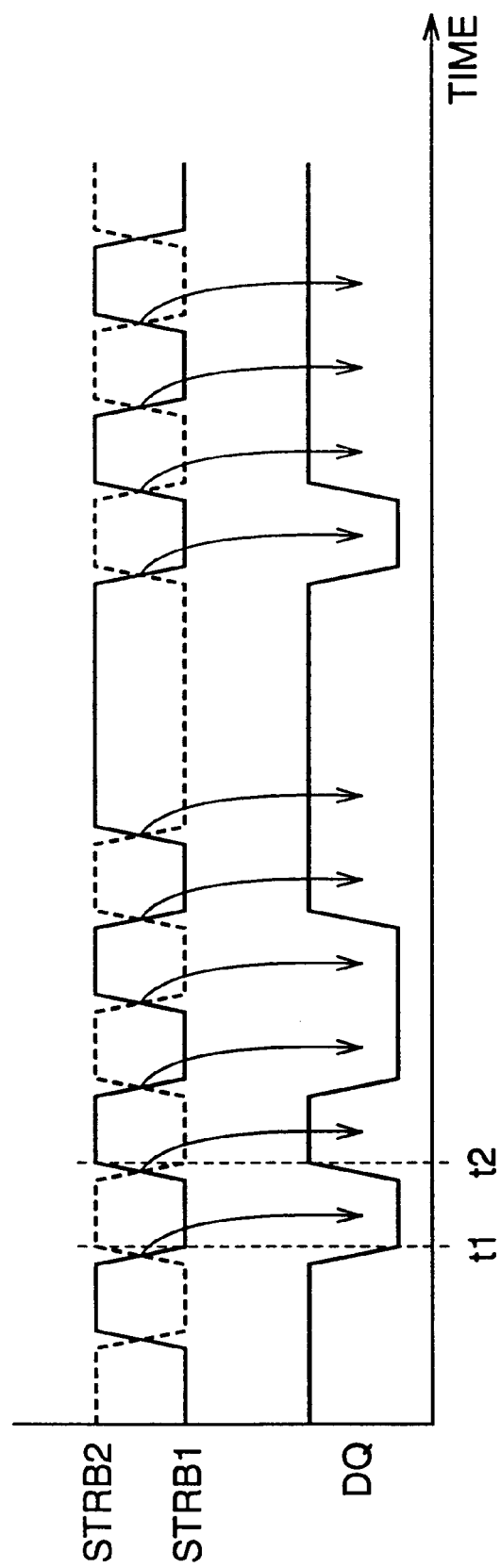
FIG. 31 is an operational waveform chart for illustrating data reception using differential data strobes.
Figure 32:
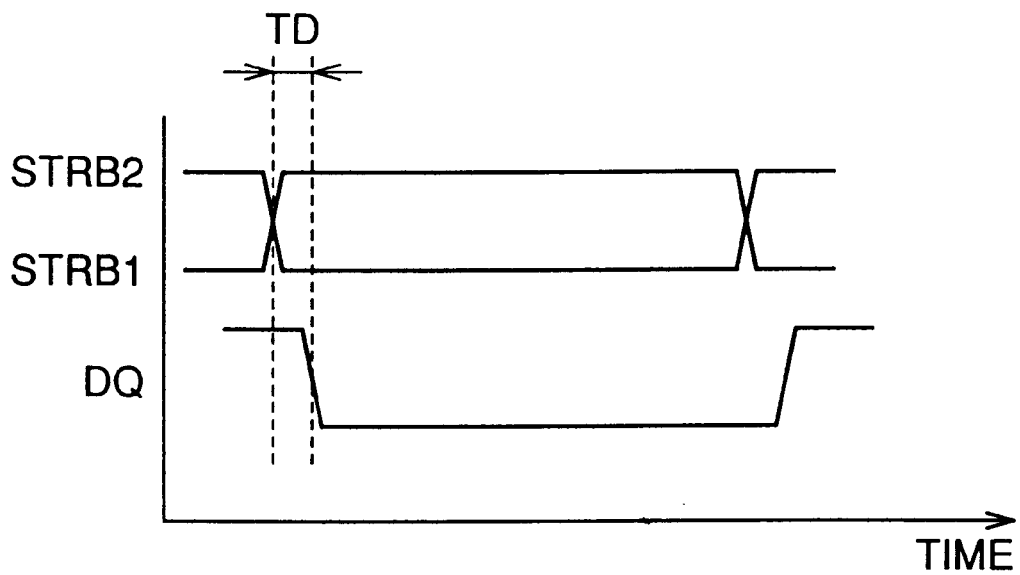
FIG. 32 is a diagram for illustrating skew caused by SSO.

FIG. 29 is an operational waveform chart for illustrating operations of preset circuit 410 and latch circuit 224.

Referring to FIG. 29, a writing operation is started by a write command at time t1, Count values A1, A0 of the 2BIT counter are increased to "00," "01," "10," according to clock signal CLK and they attain "11," at time t4.

At time t4, reset signal RST is output, and thus signal WCYCLE falls and pulse signal PRERST is output. Because of pulse signal PRERST, internal data signal IDnb is set to the L level every time a write cycle ends.

Thus, data following the L level of a preamble becomes ready for reception when the waveform as shown in FIG. 26 providing the L level to DQ as the preamble is input. Therefore, data following the L level data of the preamble can be received correctly by latch circuit 222 in FIG. 15, and data which is input following the preamble can be received at high speed.

As described above, in the fourth embodiment, data is held at both rising and falling edges of a strobe signal, and determination as to which held data is transmitted as effective data to an internal circuit is made according to the polarity of previously received data. Since the argin of setup time can be increased as a result, a much higher speed operation becomes made possible.

Although the description of the fourth embodiment is based on the input buffer circuit which serial-to-parallel converts 1-bit input data to 2 bit data and transmits it to internal circuitry, the embodiment can be applied to an input buffer circuit which transmits the 1-bit data to internal circuitry as it is. The embodiment can also be applied to an input buffer circuit which serial-to-parallel converts the 1-bit data to multiple-bit data, for example 4-bit data before transmitting it inside.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a first terminal to receive first data and second data which is input after said first data, said first and second data being supplied externally;
    a second terminal to receive, in synchronization with said first and second data, a strobe signal which is supplied externally;
    a third terminal to receive a complementary strobe signal which is complementary to said strobe signal and is supplied externally;
    a data input circuit to receive said first and second data in response to said strobe signal and said complementary strobe signal in order to output first and second internal data corresponding to said first and second data, respectively,
    said data input circuit including a selection circuit to select, as a first data reception edge at which said first data is received, one of a first edge of said strobe signal corresponding to said first data and a first complementary edge of said complementary strobe signal corresponding to said first data and then select, as a second data reception edge at which said second data is received, one of a second edge of said strobe signal corresponding to said second data and a second complementary edge of said complementary strobe signal corresponding to said second data that is input later; and an internal circuit operating according to said first and second internal data.

2. The semiconductor device according to claim 1, wherein said selection circuit includes
a first hold circuit to hold first information indicating that said first edge or second complementary edge is input,
a second hold circuit to hold second information indicating that said first complementary edge or second edge is input,
an edge output circuit to output said first and second data reception edges when said first hold circuit holds said first information and said second hold circuit holds said second information, and
a pulse generation circuit to reset said first and second hold circuits to an initial state according to an output of said edge output circuit.

3. The semiconductor device according to claim 1, wherein said data input circuit further includes
a first data reception circuit to receive said first and second data in response to a rising edge of said strobe signal and a rising edge of said complementary strobe signal,
a second data reception circuit to receive said first and second data in response to a falling edge of said strobe signal and a falling edge of said complementary strobe signal, and
a data hold circuit to receive outputs of said first and second data reception circuits in response to said first and second data reception edges and determine said first and second internal data.

4. The semiconductor device according to claim 3, wherein said data input circuit further includes
a first signal generation circuit to receive said strobe signal and output a first internal reception signal and a first complementary internal reception signal which is complementary to said first internal reception signal,
a second signal generation circuit to receive said complementary strobe signal and output a second internal reception signal and a second complementary internal reception signal which is complementary to said second internal reception signal,
a first reception control circuit to indicate said first data reception circuit to receive data at a rising edge of said first internal reception signal and a rising edge of said second internal reception signal, and
a second reception control circuit to indicate said second data reception circuit to receive data at a rising edge of said first complementary internal reception signal and a rising edge of said second complementary internal reception signal.

5. The semiconductor device according to claim 4, wherein said first reception control circuit includes
a first pulse generation circuit to generate a pulse in response to a rising edge of said first internal reception signal,
a second pulse generation circuit to generate a pulse in response to a rising edge of said second internal reception signal, and
a pulse synthesis circuit to output pulses to indicate said first data reception circuit to receive data in response to outputs of said first and second pulse generation circuits.

6. The semiconductor device according to claim 3, wherein said data input circuit further includes a complementary data generation circuit to receive said first and second data and output a data input signal and a complementary data input signal which is complementary to said data input signal,
said first data reception circuit receives said data input signal at its input, and
said second data reception circuit receives said complementary data input signal at its input.

7. The semiconductor device according to claim 6, wherein said complementary data generation circuit has
a first differential amplification circuit to receive a reference potential at its negative input node and a potential of said first terminal at its positive input node and generate said data input signal, and
a second differential amplification circuit to receive said reference potential at its positive input node and said potential of said first terminal at its negative input node and generate said complementary data input signal.

8. The semiconductor device according to claim 6, wherein said complementary data generation circuit has a differential amplification circuit to compare a potential of said first terminal with a reference potential and output said data input signal and said complementary data input signal.

9. The semiconductor device according to claim 1, wherein said first terminal is connected to an external data bus which is connected to a first power supply potential through a resistor, said semiconductor device further comprising:
a transistor to couple said first terminal to a second power supply potential different from said first power supply potential according to an output of said internal circuit.

10. A semiconductor device, comprising:
a first terminal to receive a data signal which is supplied externally;
a second terminal to receive, in synchronization with said data signal, a first strobe signal which is supplied externally for receiving said data signal;
a third terminal to receive a second strobe signal which is supplied externally and is complementary to said first strobe signal; and
a data input circuit to receive, in response to edges of said first and second strobe signals, said data signal to output an internal data signal,
said data input circuit receiving said data signal in response to a rising edge of one of said first and second strobe signals when said data signal is at a high level, and receiving said data signal in response to a falling edge of one of said first and second strobe signals when said data signal is at a low level.

11. The semiconductor device according to claim 10, wherein said data input circuit includes
a first data reception circuit to receive said data signal in response to a rising edge of said first strobe signal and a rising edge of said second strobe signal,
a second data reception circuit to receive said data signal in response to a falling edge of said first strobe signal and a falling edge of said second strobe signal, and
a data hold circuit to receive outputs of said first and second data reception circuits and determine said internal data signal.

12. A semiconductor device, comprising:
a first terminal to receive a data signal which is supplied externally and includes first data and second data input after the first data;
a second terminal to receive, in synchronization with said data signal, a first strobe signal which is supplied externally for receiving said data signal;

a third terminal to receive, from an external source, a second strobe signal which is complementary to said first strobe signal;

a data input circuit to receive said data signal according to said first and second strobe signals and output an internal data signal, said data input circuit including a strobe selection circuit to select, according to said first data, one of edges of said first and second strobe signals input in synchronization with said second data as a data reception edge at which said second data is received; and an internal circuit operating according to said internal data signal.

13. The semiconductor device according to claim 12, wherein said data input circuit further includes a first hold circuit to hold said data signal according to said first strobe signal, a second hold circuit to hold said data signal according to said second strobe signal, and a data selection circuit to select one of said first and second hold circuits according to an output of said strobe selection circuit.

14. The semiconductor device according to claim 13, wherein said data input circuit further includes a latch circuit to hold an output of said data selection circuit, and said strobe selection circuit indicates said data selection circuit to select one of said first and second hold circuits that has received said data signal at a falling edge when a value held in said latch circuit corresponds to said data signal at a high level, and indicates said data selection circuit to select one of said first and second hold circuits that has received said data signal at a rising edge when a value held in said latch circuit corresponds to said data signal at a low level.

15. The semiconductor device according to claim 14, wherein said data input circuit further includes a pulse signal generation circuit to generate first and second pulse signals in response to rising and falling edges, respectively, of said first strobe signal and generate third and fourth pulse signals in response to rising and falling edges, respectively, of said second strobe signal, and said strobe selection circuit receives said first and second pulse signals to detect a rising edge and a falling edge of said first strobe signal, and receives said third and fourth pulse signals to detect a rising edge and a falling edge of said second strobe signal.

16. The semiconductor device according to claim 14, wherein said first hold circuit has first and second sub hold circuits to hold said data signal in response to the rising and falling edges of the first strobe signal, respectively;

said second hold circuit has third and fourth sub hold circuits to hold said data signal in response to the rising and falling edges of the second strobe signal, respectively;

said data selection circuit has a first sub selection circuit to select one of outputs of said first and fourth sub hold circuits, and a second sub selection circuit to select one of outputs of said second and third sub hold circuits;

said latch circuit has first and second sub latch circuits to hold outputs of said first and second sub selection circuits, respectively; and said strobe selection circuit has a first gate circuit to indicate said first sub selection circuit to perform selection according to an output of said second sub latch circuit, and a second gate circuit to indicate said second sub selection circuit to perform selection according to an output of said first sub latch circuit.

17. The semiconductor device according to claim 12, further comprising:

a data output circuit to receive a plurality of output data from said internal circuit and successively output the plurality of output data to an externally connected data bus, wherein said data output circuit sets said data bus to a prescribed logical level before outputting said plurality of output data.

18. The semiconductor device according to claim 17, wherein said data output circuit outputs said plurality of output data in synchronization with a clock signal, and includes a counter circuit to perform a counting operation according to said clock signal, a reset generation circuit to generate a reset signal according to a count value of said counter circuit, and a latch circuit to reset an output to a value corresponding to said prescribed logical level when said reset signal is activated, and receive and hold said output data output from said internal circuit when said reset signal is inactivated.

19. The semiconductor device according to claim 18, wherein said data bus is connected to said first terminal, and said data output circuit further includes a drive circuit activated in response to an output activation signal for driving said first terminal according to an output of said latch circuit, and an output control circuit to output said output activation signal according to said count value.

* * * * *